(12) United States Patent
Matsuoka et al.

(10) Patent No.: US 7,953,180 B2
(45) Date of Patent: May 31, 2011

(54) TRANSMISSION POWER CONTROL METHOD AND TRANSMISSION APPARATUS

(75) Inventors: Akihiko Matsuoka, Kanagawa (JP); Tomoya Urushihara, Chiba (JP); Gary Do, San Jose, CA (US); Wayne Lee, San Mateo, CA (US)

(73) Assignee: Panasonic Corporation, Osaka (JP)

( * ) Notice: Subject to any disclaimer, the term of this patent is extended or adjusted under 35 U.S.C. 154(b) by 722 days.

(21) Appl. No.: 12/013,306

(22) Filed: Jan. 11, 2008

(65) Prior Publication Data

US 2009/0285329 A1    Nov. 19, 2009

Related U.S. Application Data

(60) Provisional application No. 60/880,056, filed on Jan. 12, 2007.

(51) Int. Cl.
*H04K 1/02* (2006.01)
*H04L 25/03* (2006.01)
*H04L 25/49* (2006.01)
*H04L 27/00* (2006.01)

(52) U.S. Cl. ........ 375/297; 375/295; 375/296; 327/291; 341/20; 341/173

(58) Field of Classification Search .................... 375/297
See application file for complete search history.

(56) References Cited

U.S. PATENT DOCUMENTS

| 6,781,470 | B2* | 8/2004 | Rogerson | 331/57 |
| 6,895,059 | B2* | 5/2005 | Rogerson et al. | 375/295 |
| 7,321,601 | B2* | 1/2008 | Rogerson et al. | 370/478 |
| 7,436,899 | B2* | 10/2008 | Rogerson et al. | 375/295 |
| 7,609,608 | B2* | 10/2009 | Rogerson et al. | 370/203 |
| 2002/0154708 | A1 | 10/2002 | Rouphael | |
| 2003/0085766 | A1* | 5/2003 | Rogerson | 331/57 |
| 2003/0099299 | A1* | 5/2003 | Rogerson et al. | 375/253 |
| 2003/0137346 | A1* | 7/2003 | Hellberg | 330/124 R |
| 2003/0202537 | A1* | 10/2003 | Rogerson et al. | 370/478 |

(Continued)

FOREIGN PATENT DOCUMENTS

JP    2005-295523    10/2005

(Continued)

OTHER PUBLICATIONS

International Search Report dated Apr. 15, 2008.

*Primary Examiner* — David C. Payne
*Assistant Examiner* — Erin M File
(74) *Attorney, Agent, or Firm* — Dickinson Wright PLLC

(57) ABSTRACT

Even when there is limit placed upon transmission power control time, the transmission power control method enables accurate control transmission power. The transmission power control method includes: a first measuring step of measuring, in a symbol interval before a symbol interval where mode of the power amplifier changes, output power of the power amplifier before mode changes; a first setting step of setting target power of the power amplifier after mode changes based on a measurement result obtained in the first measuring step and a transmission power control signal; a second measuring step of measuring, in the symbol interval where mode of the power amplifier changes, output power of the power amplifier after mode changes, the output power being controlled using the target power set in the first setting step; and a second step of setting corrected target power based on a measurement result obtained in the second measuring step.

3 Claims, 22 Drawing Sheets

U.S. PATENT DOCUMENTS

| | | | |
|---|---|---|---|
| 2004/0008729 A1* | 1/2004 | Rogerson et al. | 370/478 |
| 2005/0232371 A1* | 10/2005 | Rogerson et al. | 375/295 |
| 2006/0140145 A1 | 6/2006 | Ogawa | |
| 2008/0130685 A1* | 6/2008 | Rogerson et al. | 370/478 |
| 2008/0146174 A1* | 6/2008 | Flowers | 455/127.1 |
| 2008/0299923 A1* | 12/2008 | O'Brien et al. | 455/127.1 |
| 2009/0245419 A1* | 10/2009 | Chan et al. | 375/297 |

FOREIGN PATENT DOCUMENTS

JP     2006-186690     7/2006

* cited by examiner

| TPC COMMAND | TRANSMISSION POWER CONTROL RANGE | | | | | |
|---|---|---|---|---|---|---|
| | 1dB STEP SIZE | | 2dB STEP SIZE | | 3dB STEP SIZE | |
| | LOWER SIDE | UPPER SIDE | LOWER SIDE | UPPER SIDE | LOWER SIDE | UPPER SIDE |
| 1 | +0.5dB | +1.5dB | +1dB | +3dB | +1.5dB | +4.5dB |
| 0 | −0.5dB | +0.5dB | −0.5dB | +0.5dB | −0.5dB | +0.5dB |
| −1 | −0.5dB | −1.5dB | −1dB | −3dB | −1.5dB | −4.5dB |

| TARGET STEP SIZE | STEP SIZE TOLERANCES |
|---|---|
| 0dB | +/−0.5dB |
| 1dB | +/−0.5dB |
| 2dB | +/−1.0dB |
| 3dB | +/−1.5dB |
| 4−10dB | +/−2.0dB |
| 11−15dB | +/−3.0dB |
| 16−20dB | +/−4.0dB |
| ≥21dB | +/−6.0dB |

MOST RESTRICTIVE

| TPC COMMAND GROUP | TRANSMISSION POWER CONTROL RANGE AFTER 10 EQUAL TPC COMMAND GROUPS ARE PERFORMED | | | | | | TRANSMISSION POWER CONTROL RANGE AFTER 7 EQUAL TPC COMMAND GROUPS ARE PERFORMED | |
|---|---|---|---|---|---|---|---|---|
| | 1dB STEP SIZE | | 2dB STEP SIZE | | 3dB STEP SIZE | | | |
| | LOWER SIDE | UPPER SIDE | LOWER SIDE | UPPER SIDE | LOWER SIDE | UPPER SIDE | LOWER SIDE | UPPER SIDE |
| +1 | +8dB | +12dB | +16dB | +24dB | | | +16dB | +26dB |
| 0 | +1dB | +1dB | −1dB | +1dB | | | −1dB | +1dB |
| −1 | −8dB | −12dB | −16dB | −24dB | | | −16dB | −26dB |
| 0,0,0,+1 | +6dB | +14dB | N/A | N/A | | | N/A | N/A |
| 0,0,0,−1 | −6dB | −14dB | N/A | N/A | | | N/A | N/A |

IN THIS TABLE, THESE REQUIREMENTS ARE THE MOST RESTRICTIVE (AFTER 10 EQUAL STEPS WHICH ARE EACH 1 dB ARE PERFORMED, POWER DIFFERENCE MUST BE WITHIN 10 ± 2 dB)

FIG.5 (RELATED ART)

| VARIABLE | DEFINITION |
|---|---|
| PAM1,j | AM PATH SIGNAL POWER OF FIRST AM PATH AVERAGING TIMING |
| AM1,j | AM PATH SIGNAL OF FIRST AM PATH AVERAGING TIMING |
| PAM1,avg | AM PATH SIGNAL AVERAGE POWER OF FIRST AM PATH AVERAGING TIMING |
| PAM1 | LOG VALUE OF AM PATH SIGNAL AVERAGE POWER OF FIRST AM PATH AVERAGING TIMING |
| PAM2,j | AM PATH SIGNAL POWER OF SECOND AM PATH AVERAGING TIMING |
| AM2,j | AM PATH SIGNAL OF SECOND AM PATH AVERAGING TIMING |
| PAM2,avg | AM PATH SIGNAL AVERAGE POWER OF SECOND AM PATH AVERAGING TIMING |
| PAM2 | LOG VALUE OF AM PATH SIGNAL AVERAGE POWER OF SECOND AM PATH AVERAGING TIMING |
| FAM | RESIDUAL DRIFT COMPONENT OF AM PATH SIGNAL |
| PADC1,j | PA OUTPUT POWER OF FIRST ADC SAMPLING TIMING |
| PADC1 | PA AVERAGE OUTPUT POWER OF FIRST ADC SAMPLING TIMING |
| PADC2,j | PA OUTPUT POWER OF SECOND ADC SAMPLING TIMING |
| PADC2 | PA AVERAGE OUTPUT POWER OF SECOND ADC SAMPLING TIMING |
| FADC | RESIDUAL DRIFT COMPONENT INCLUDED IN PA OUTPUT SIGNAL READ ACCORDING TO ADC |
| Crel | DRIFT ESTIMATION COEFFICIENT |
| ΔP | AMOUNT OF POWER CHANGE |
| Pcur_set | POWER SETTING OF CURRENT POWER |
| Ptar_set | POWER SETTING OF TARGET POWER |
| Pcur,k | POWER IN CURRENT MODE READ ACCORDING TO ADC |
| Pcur | AVERAGE POWER IN CURRENT MODE READ ACCORDING TO ADC |
| AMcur,i | AM PATH SIGNAL IN CURRENT MODE |
| PAM_cur,i | AM PATH SIGNAL POWER IN CURRENT MODE |
| PAM_cur_avg | AM PATH SIGNAL AVERAGE POWER IN CURRENT MODE |
| PAM_cur | LOG VALUE OF AM PATH SIGNAL AVERAGE POWER IN CURRENT MODE |
| Ptar,k | POWER IN TARGET MODE READ ACCORDING TO ADC |
| Ptar | AVERAGE POWER IN TARGET MODE READ ACCORDING TO ADC |
| AMtar,i | AM PATH SIGNAL IN TARGET MODE |
| PAM_tar,i | AM PATH SIGNAL POWER IN TARGET MODE |
| PAM_tar_avg | AM PATH SIGNAL AVERAGE POWER IN TARGET MODE |
| PAM_tar | LOG VALUE OF AM PATH SIGNAL AVERAGE POWER IN TARGET MODE |
| Ptar_set | ADJUSTED POWER SETTING IN TARGET MODE |

FIG.24

TRANSMISSION POWER CONTROL METHOD AND TRANSMISSION APPARATUS

CROSS REFERENCE TO RELATED APPLICATIONS

The disclosure of U.S. Patent Application No. 60/880,056, filed on Jan. 12, 2007, including the specification, drawings and abstract, is incorporated herein by reference in its entirety.

BACKGROUND OF THE INVENTION

1. Field of the Invention

The present invention relates to a polar modulation transmitter and its transmission power control method.

2. Description of Related Art

FIG. 1 shows an example of a typical transmission apparatus using a polar modulation scheme. The transmission apparatus has polar signal generation circuit 1, amplitude control circuit 2, phase modulated signal generation circuit 3 and power amplifier (hereinafter "PA") 4. In this transmission apparatus, the polar signal generation circuit 1 generates a signal from an input signal (i.e. a transmission modulated signal) signals related to the amplitude and phase of a transmission modulated signal. Amplitude control circuit 2 controls power supply voltage supplied to PA 4 based on amplitude component signals, and phase modulated signal generation circuit 3 generates phase modulated signals inputted to PA 4 based on phase component signals.

In practice, this transmission apparatus secures the dynamic range of transmission power by changing PA 4 between compressed mode and uncompressed mode. Further, compressed mode may be paraphrased as "saturated operation mode" and uncompressed mode as "non-saturated operation mode."

This transmission apparatus operates PA 4 in compressed mode when high transmission power is required. On the other hand, the transmission apparatus operates PA 4 in uncompressed mode when low transmission power is required. To be more specific, in compressed mode, the transmission apparatus performs amplitude modulation by changing the power supply to PA 4 according to amplitude component signals. This compressed mode is inherently very accurate with respect to output power. On the other hand, in uncompressed mode, the transmission apparatus operates PA 4 in a less accurate condition than compressed mode with respect to output power.

However, with conventional transmission apparatuses, when compressed mode ("c-mode") and uncompressed mode ("u-mode") change in transmission power control, transmission power drift of maximum 5 dB or greater is likely to occur due to differences in characteristics between modes (i.e. drift due to temperature, drift due to wear, and drift due to load, etc.).

This will be explained briefly using FIG. 2. As shown in FIG. 2, output power in compressed mode is relatively accurate, but output power in uncompressed mode changes due to drift (i.e. drift due to temperature, drift due to wear, and drift due to load, etc.).

As shown in FIG. 2, output power in uncompressed mode is likely to drift due to various factors, and so, when compressed mode and uncompressed mode change, output power in uncompressed mode is likely to be discontinuous, and, as a result, significant drift in transmission power is likely to occur.

By the way, one method of performing transmission power control accurately is to measure the actual output power of a power amplifier and perform feedback control of output power such that this measurement value becomes equal to a set target value.

Generally, for this feedback control, the method of eliminating modulation drift components resulting from transmission data from output of the power amplifier using a low-pass filter, is employed. Then, transmission power is adjusted based on the difference between the set target value and the average transmission power which eliminates modulation drift components.

Here, more drift components such as modulated components can be eliminated by setting the time constant for the low-pass filter greater, so that it is possible to perform more accurate transmission power control.

On the other hand, if the time constant for a low-pass filter is set greater, the response of the low-pass filter becomes poorer, and, consequently, accompanying this, the responsivity of feedback control becomes poorer. There are wireless communication standards that require that transmission power control be completed in a very short period, and so, in practice, the time constant for the low-pass filter cannot be set greater significantly.

Particularly, when the above compressed mode and uncompressed mode change, feedback control with higher speed is needed, and so it becomes more difficult to make the time constant for the low-pass filter greater.

For example, according to 3GPP (3rd Generation Partnership Project) 25.101, differences in transmission power need to fulfill the requirements shown in FIG. 3 to FIG. 5.

This will be explained in detail. The Third Generation Partnership Project (3GPP), which is the standards body responsible for promulgating UMTS and W-CDMA standards, requires that TPC commands from a cellular network base station result in a mobile terminal increasing or decreasing its output power level in discrete steps (e.g., +/−1 dB, +/−2 dB, +/−3 dB, etc.). The UMTS standard also specifies that these power increasing and decreasing steps be performed within certain specified tolerances.

For example, as shown in the table of FIG. 3, in case of a TPC command for increasing and decreasing output power by a +/−1 dB step, resulting output power is required to be within +/−0.5 dB of target output power. Then, for example, if the transmission apparatus of a mobile terminal operates at output power 0 dBm and receives a TPC command for "1," the transmission apparatus of the mobile terminal must adjust transmission power to be within the range between +0.5 dBm and 1.5 dBm. Wider tolerances of +/−1 dB and +/−1.5 dB are permitted for larger step sizes of 2 dB and 3 dB.

The 3GPP UMTS standard also imposes cumulative tolerances for groups of power commands, as shown in the table in FIG. 5. It is required that, for, for example, ten equal TPC commands of 1 dB step size each, the resulting output power level be within +/−2 dB of the target output power level.

As shown in the list of the table of FIG. 3 and FIG. 4, the most restrictive step size for a single TPC command is for a TPC command directing a+/−1 dB (+/−0.5 dB tolerance is required).

By the way, according to the 3GPP standard, power control is required to be performed within the range of ±25 μsec from the symbol boundary.

When compressed mode and uncompressed mode change, it is difficult for conventional transmission apparatuses to fulfill the above requirements.

SUMMARY OF THE INVENTION

It is an object of the present invention to provide a transmission power control method for enabling accurate transmission power control even when there is limit placed upon transmission power control time.

The transmission power control method according to the present invention in a transmission apparatus with mode of operating a power amplifier in compressed mode and mode of operating the power amplifier in uncompressed mode, includes: a first measuring step of measuring, in a symbol interval before a symbol interval where mode of the power amplifier changes, output power of the power amplifier before mode changes; a first setting step of setting target power of the power amplifier after mode changes based on a measurement result obtained in the first measuring step and a transmission power control signal; a second measuring step of measuring, in the symbol interval where mode of the power amplifier changes, output power of the power amplifier after mode changes, the output power being controlled using the target power set in the first setting step; and a second step of setting corrected target power based on a measurement result obtained in the second measuring step.

According to the present invention, it is possible to provide a transmission power control method for enabling improvement in the accuracy of transmission power control by controlling transmission power in a limited predetermined period reliably even when there is limit placed upon timing to complete transmission power control.

BRIEF DESCRIPTION OF THE DRAWINGS

The above and other objects and features of the invention will appear more fully hereinafter from a consideration of the following description taken in connection with the accompanying drawings, in which:

FIG. 5 shows cumulative power control tolerances for groups of power commands according to the 3GPP UMTS standard;

FIG. 24 illustrates variables used in the flowcharts of FIG. 9 to FIG. 12, FIG. 23 and FIG. 23.

DETAILED DESCRIPTION OF THE PREFERRED EMBODIMENT

With reference now to the attached drawings, embodiments of the present invention will be explained in detail below.

Embodiment 1

Figure 6:
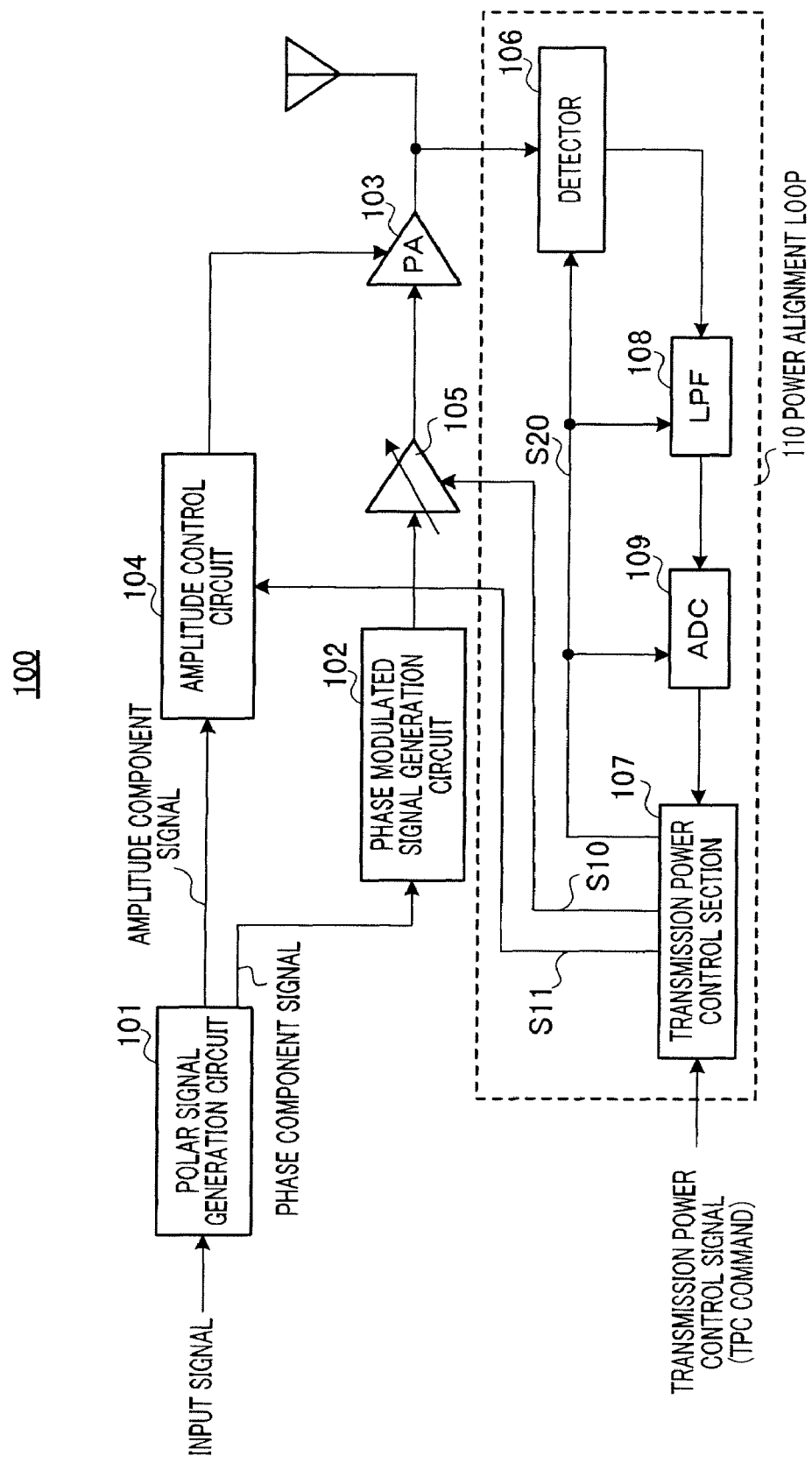
FIG. 6 is a block diagram showing a configuration of a transmission apparatus according to Embodiment 1 of the present invention.

FIG. 6 shows the configuration of polar modulation transmitter 100 according to Embodiment 1 of the present invention. Polar modulation transmitter 100 of FIG. 6 has polar signal generation circuit 101, phase modulated signal generation circuit 102, power amplifier (PA) 103, amplitude control circuit 104, variable amplifier 105 formed with a variable gain amplifier (VGA) and/or an attenuator, and power alignment loop 110.

Power alignment loop 110 has detector 106 that detects output power of PA 103, low-pass filter (LPF) 108, analogue-to-digital converter (ADC) 109 and transmission power control section 107.

Polar signal generation circuit 101 generates amplitude component signals and phase component signals from the input signals. To be more specific, polar signal generation circuit 101 operates according to the input signals from spreading section 110, and generates envelope component signals (i.e. amplitude component signals) containing amplitude information of the input signals, and constant-envelope component signals (i.e. phase component signals) containing phase information of the input signals. The amplitude component signals are inputted to amplitude control circuit 104 and the constant amplitude phase component signals are inputted to phase modulated signal generation circuit 102.

Phase modulated signal generation circuit 102 generates RF phase modulated signals from the phase component signals. Variable amplifier 105 amplifies and attenuates the RF phase modulated signals based on phase path scaling coefficients (i.e. phase-path magnitude scaling) S10 obtained at power alignment loop 107, and then supplies the scaled RF phase modulated signals to the RF signal input terminal of PA 103.

Amplitude control circuit 104 generates power supply voltage of PA 103 by multiplying the amplitude component signals by amplitude path scaling coefficients (i.e. AM-path envelope scaling) S11 from transmission power control section 107, and supplies this power supply voltage to the power supply input terminal of PA 103.

Detector 106 is formed with, for example, PIN diodes or other semiconductor detectors, and detects output power of PA 103.

LPF 108 is formed with, for example, an RC circuit and obtains an average output power value of PA 103 by integrating output power detection results of PA 103. LPF 108 is provided to reduce drift in the output power detection value of PA 103 obtained by detector 106.

By the way, if the cut-off frequency of LPF 108 is set too high, drift cannot be reduced sufficiently. On the other hand, if the cut-off frequency is set too low, output of LPC 108 after power adjustment takes time to become stable, and so it is difficult to finish power control within the time designated according to, for example, the 3GPP standard. By the way, according to the 3GPP standard, power control is required to be performed within the range of ±25 μsec from the symbol boundary.

To meet this requirement, the time constant for LPF 108 needs to be less than several μsec. In practice, the time constant for LPF 108 needs to be set such that instantaneous envelope drift in a modulated signal can be canceled, and drift slower than the fundamental period of the spread modulated signals resulting from patterns of the spreading codes may remain (i.e. the chip rates for the spreading codes). The cut-off frequency is preferably in the range of several dozens to hundreds of kHz. In this embodiment, as an example, the cut-off frequency is 300 kHz.

ADC 109 samples output results of LPF 108.

Transmission power control section 107 receives an input of output of detector 106 through LPF 108 and ADC 109. Further, transmission power control section 107 checks whether a transmission power control signal is reported from a communicating party (not shown) on a per slot basis, and, if a report is received, sets transmission control power value ΔP of the next symbol at the symbol boundary. At this time, transmission power control section 107 controls the power supply voltage level of PA 103 and the input signal (i.e. RF phase modulated signal) level of PA 103 by calculating average output power value $P_{cur}$ of PA 103 before the symbol boundary where transmission power control value ΔP is set and, after transmission power control value ΔP is set, sending out scaling coefficients S10 and S11 to amplitude control circuit 104 and the phase path scaling coefficients to variable amplifier 105, respectively.

To be more specific, transmission power control section 107 calculates final scaling coefficients S10 and S11 by summing the original values of scaling coefficients obtained by referring to a table using the transmission power set values as addresses, and the correction values of scaling coefficients determined from the detection result of detector 106.

That is, transmission power control section 107 of this embodiment has a table associating TPC commands with scaling coefficients (hereinafter referred to as the "power table").

Figure 7:
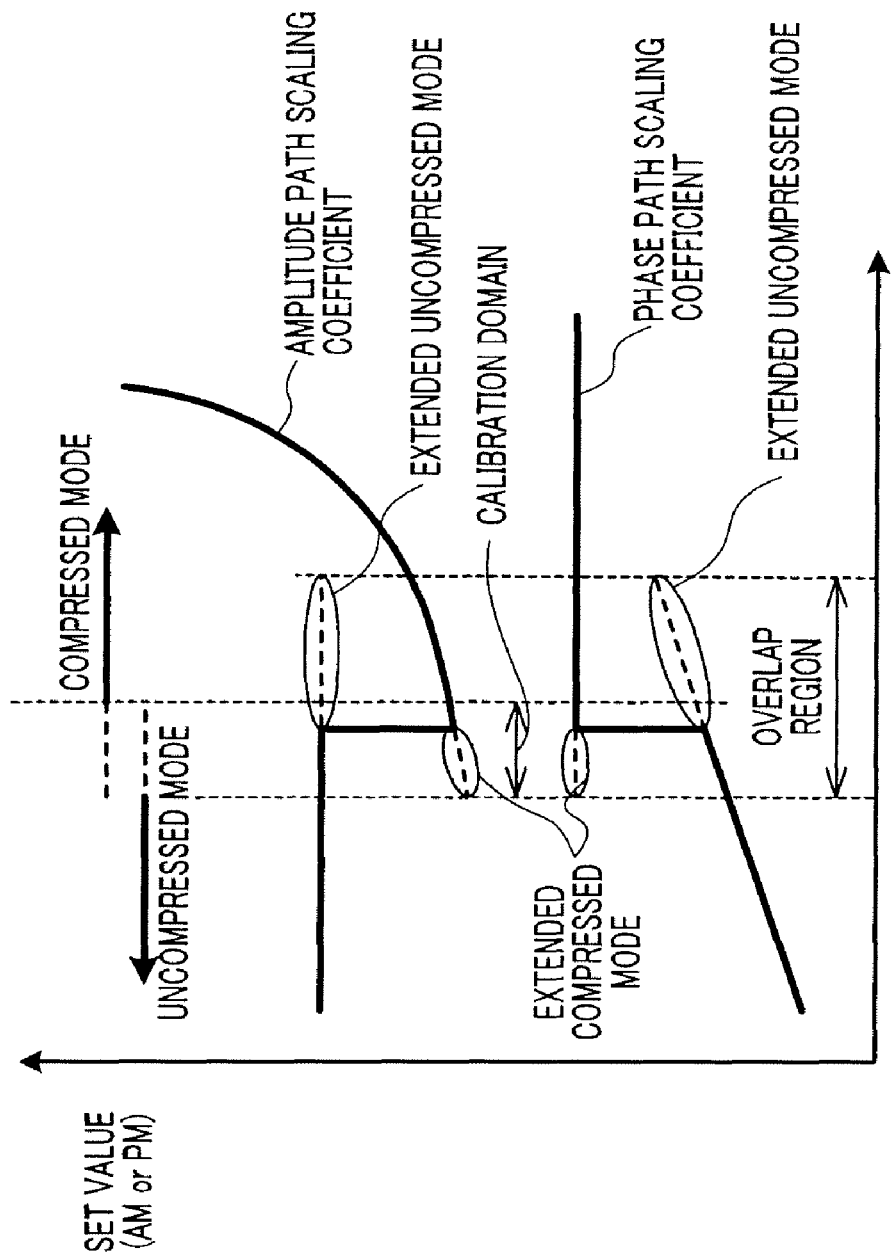
FIG. 7 illustrates a set of scaling coefficients provided in a transmission power control section.

FIG. 7 illustrates a set of scaling coefficients of the power table provided in transmission power control section 107. In compressed mode, the output power of polar modulation transmitter 100 is controlled based on power supply voltage that is subjected to amplitude modulation and given to the collector (or drain) node of PA 103, and the power of a phase modulated RF signal with a constant amplitude is kept constant. In uncompressed mode, output power of PA 103 is controlled by keeping constant the scaling coefficients multiplied upon the envelope of the amplitude path and changing the scaling coefficients multiplied upon a drive signal in the phase path. However, in either operation mode, the scaling coefficients (that is, in compressed mode, the phase path scaling coefficients multiplied upon phase modulated RF signals, and, in uncompressed mode, the amplitude path scaling coefficients multiplied upon the envelope of the amplitude path) that are not used in power control, do not need to be kept constant, and may be adjusted to correct output power or improve output distortion characteristics or noise characteristics of a power amplifier.

In practice, as shown in FIG. 7, transmission power control section 107 has a set of compressed mode scaling coefficients and a set of uncompressed mode scaling coefficients. In this embodiment, the set of compressed mode scaling coefficients and the set of uncompressed mode scaling coefficients have an overlap region in the mode transition area.

Even when either one of compressed mode and uncompressed mode is selected, the overlap region is where required output power can be generated. To be more specific, in practice, compressed mode and uncompressed mode can be realized by providing the amplitude path scaling coefficients and phase path scaling coefficients shown by solid lines in FIG. 7. With this embodiment, the set of scaling coefficients shown by dotted lines are provided in addition to the set of scaling coefficients shown by solid lines, thereby providing an overlap region where the ranges of a compressed mode region and an uncompressed mode region are extended to enable PA to operate in either compressed mode or uncompressed mode is available.

The calibration region refers to an output power range where discontinuity in transmission power is likely to occur upon mode transition and where calibration is likely to be necessary. With this embodiment, mode change of PA 103 is performed by selecting scaling coefficients S10 and S11 so as not to allow discontinuity in transmission power in this calibration region.

In this way, whether PA 103 operates in compressed mode or in uncompressed mode is determined according to scaling coefficients calculated by transmission power control section 107.

An example of a method of calculating scaling coefficients will be explained below. Scaling coefficients in the power table are as shown in table 1.

[Table 1]

TABLE 1 example of data set stored in the power table

| Address | Output power level setting value | Phase path scaling coefficient | Amplitude path scaling coefficient |
|---|---|---|---|
| 001 | −11 dBm | 90 | 100 |
| 002 | −10 dBm | 100 | 100 |
| 003 | −9 dBm | 110 | 100 |
| 004 | −8 dBm | 120 | 100 |
| ... | ... | ... | 100 |

Here, a method of calculating phase path scaling coefficients will be explained with reference to a case where, when polar modulation transmitter 100 operating in uncompressed mode performs "outputting phase path scaling coefficient 100 at output power −10 dBm in PA 103," transmission power control section 107 starts and decides to "increase output power of PA 103 because the level difference from the output power level in compressed mode operation is 0.3 dBm."

According to table 1, as the change from the phase path scaling coefficient "100" during uncompressed mode operation, the phase path scaling coefficient is set to "103" by adding an increase "+3" of the phase path scaling coefficient equal to an increase "+0.3 dBm" of the output power level.

Further, to increase output of PA 103 by only "+1 dBm," the above calculation needs not to be performed, and "address 003" adjacent to "address 002" storing scaling coefficient "100," may be referred to directly.

Figure 1:
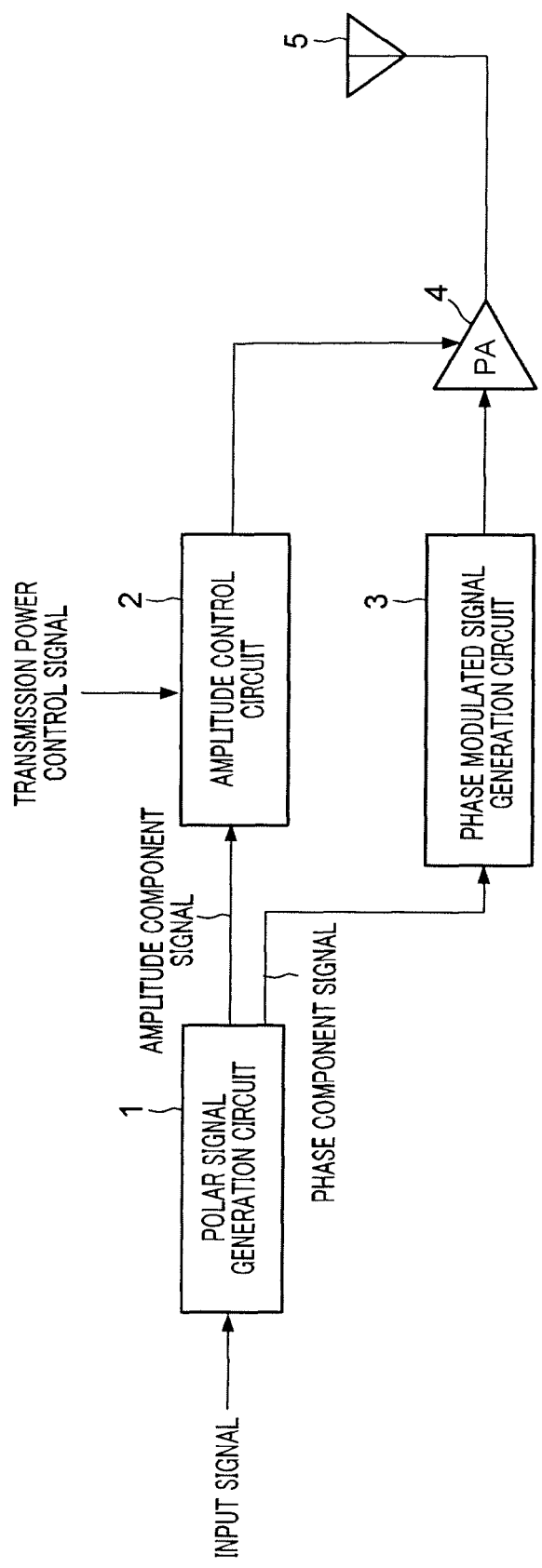
FIG. 1 is a block diagram showing a configuration example of a conventional transmission apparatus.
Figure 2:
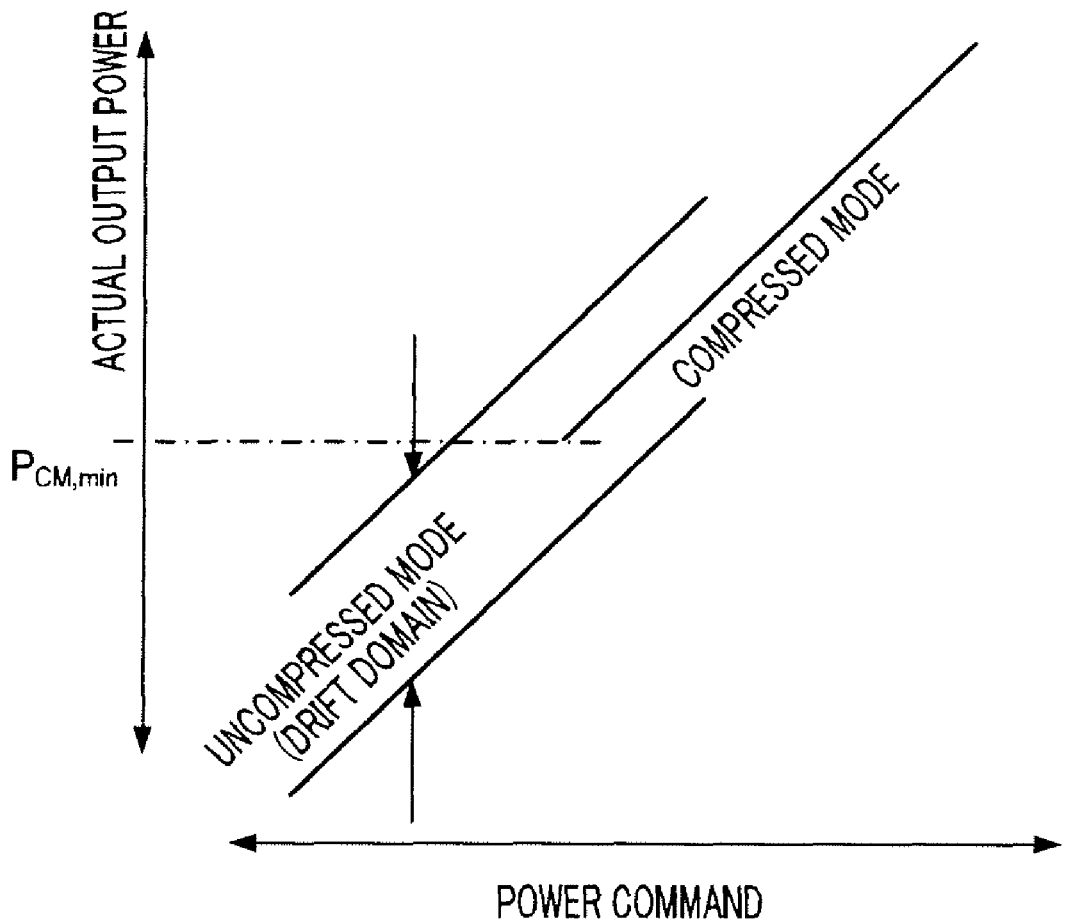
FIG. 2 illustrates drift in transmission power (i.e. discontinuity in output power) resulting from a mode change.
Figures 3, 4:
FIG. 3 shows power control tolerances for output power step size commands according to the 3GPP UMTS standard.
FIG. 4 lists tolerance step sizes.

In this embodiment, detector 106, LPF 108 and ADC 109 of power alignment loop 110 operate only when necessary. To be more specific, according to inputted TPC commands, transmission power control section 107 sends out ON/OFF control signal S20 to LPF 108 and ADC 109. For example, as shown in FIG. 4, if a TPC command specifies restrictive target step size tolerances such as 1 dB, 2 dB, and 3 dB, an ON control signal is outputted as ON/OFF control signal S20. By contrast with this, if a TPC command specifies less restrictive target step size tolerances such as 4 dB or greater, an OFF control signal is outputted as ON/OFF control signal S20. In this way, power alignment loop 110 can be operated only when necessary, practically, so that it is possible to reduce power consumption.

As explained above, by measuring output power of PA 103 by power alignment loop 110 and selecting amplitude path scaling coefficients S11 and phase path scaling coefficients S10, polar modulation transmitter 100 of this embodiment is able to reduce discontinuity (in particular, discontinuity upon mode transition) in output power of PA 103 upon transmission power change.

In addition, in polar modulation transmitter 100 of this embodiment, when operation mode of PA 103 changes, transmission power control section 107 calculates average output power value $P_{tar}$ of PA 103 after mode changes, corrects target transmission power $P_{tar\_set}$ based on average value $P_{cur}$ before mode changes and average value $P_{tar}$ after mode changes, and controls transmission power based on corrected target transmission power $P'_{tar\_set}$. Further, transmission power control section 107 calculates corrected output average value $P'_{tar}$ of PA 103, corrects target transmission power $P'_{tar\_set}$ again based on corrected target transmission power $P'_{tar\_set}$ and corrected average output power value $P'_{tar}$ of PA 103, and controls transmission power based on re-corrected target transmission power $P''_{tar\_set}$.

Hereinafter, the operation of polar modulation transmitter 100 with the above configuration will be explained.

First, polar signal generation circuit 101 generates amplitude component signals and phase component signals from input signals, and phase modulated signal generation circuit 102 generates RF phase modulated signals from the phase component signals. Then, variable amplifier 105 amplifies and outputs the RF phase modulated signals to PA 103.

On the other hand, amplitude control circuit 104 generates power supply voltage signals by multiplying the amplitude component signals by scaling coefficients from transmission power control section 107 and supplies the power supply voltage signals to a power supply terminal of PA 103. As a result, output power of PA 103 is adjusted.

Detector 106 detects output power of PA 103, LPF 108 integrates the detection result of output power of PA 103 and ADC 109 samples the output result of LPF 108.

Transmission power control section 107 checks whether or not a transmission power control signal is reported from a communicating party (i.e. base station apparatus) on a per slot basis, and, if a report is received, sets transmission power control value ΔP of a next symbol based on the reported transmission power control signal.

Detector 106 measures output power of PA 103 before the symbol boundary where transmission power control value ΔP is set and before mode changes, and outputs the measurement result to transmission power control section 107 through LPF 108 and ADC 109.

When transmission power control value ΔP is set, transmission power control section 107 outputs scaling coefficients S11 and S10 to amplitude control circuit 104 and variable amplifier 105, and the power supply voltage level of PA 103 and the input signal (i.e. RF phase modulated signal) level of PA 103 are controlled. The levels are controlled, and, consequently, when mode changes, output power of PA 103 after mode changes is measured, and the power supply voltage level of PA 103 and the input signal level of PA 103 are corrected based on the amount of drift in output power of PA 103 between before and after mode changes.

Further, transmission power control section 107 re-corrects the power supply voltage level of PA 103 and the input signal level of PA 103 based on the amount of drift in output power of PA 103 between before and after correction is performed.

Next, the operation of transmission control section 107 will be explained in details with reference to drawings.

Figure 8:
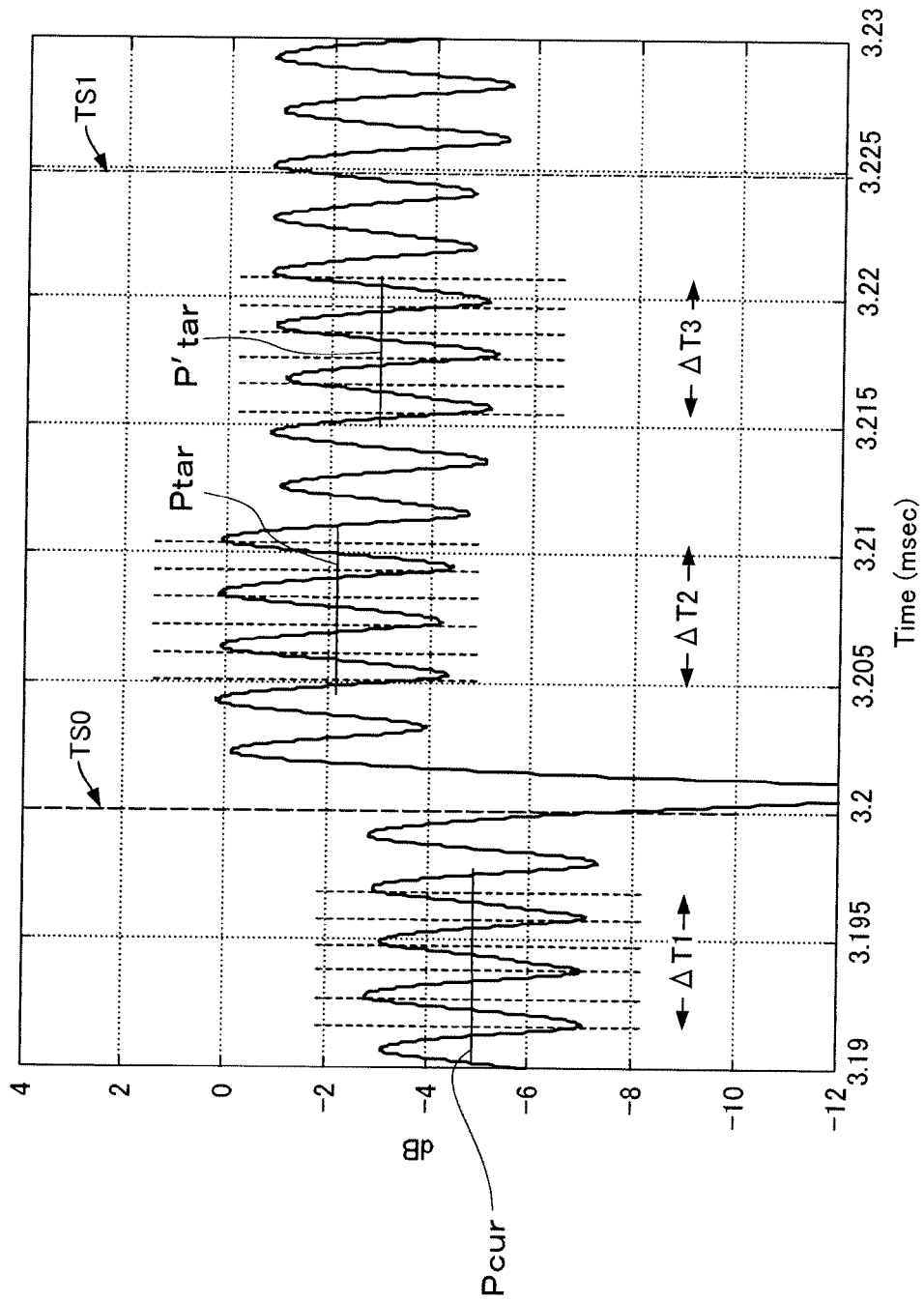
FIG. 8 shows the output waveform of the PA outputted through the LPF and averaging intervals.

FIG. 8 shows the output waveform of PA 103 outputted through LPF 108 and average values of the output waveform of PA 103 when HSUPA (High Speed Uplink Packet Access) signals are inputted to polar modulation generation circuit 101. HSUPA signals are UMTS/WCDMA uplink signals standardized according to 3GPP. In FIG. 8, the horizontal axis is time and the vertical axis is power of an output waveform. In FIG. 8, 3.2 msec is symbol boundary timing TS0, transmission power control value ΔP of the next symbol is set at symbol boundary timing TS0 according to the transmission power control signals which are likely to be reported on a per slot basis from the base station apparatus. According to TS25.101 of 3GPP, transmission power control must be completed within +/−25 μsec from symbol boundary timing TS0. In FIG. 8, timing TS1 is the timing where 25 μsec has passed from symbol boundary timing TS0, and, according to TS25.101 of 3GPP, transmission power control needs to be completed by this timing TS1.

First, transmission power control section 107 calculates average output power value $P_{cur}$ of PA 103 in averaging interval ΔT1 before symbol boundary timing TS0 where transmission power control value ΔP is set. In FIG. 8, an example shows that average value $P_{cur}$ is calculated using six samples. Further, the number of samples is not limited to six and is determined according to the relationship between the sampling clock frequency of ADC 109, the specified period when transmission power control must be completed and the number of times for acquiring average values within a specified period.

When transmission power control value ΔP is set, transmission power control section 107 calculates scaling coefficients S11 and S10 based on target transmission power $P_{tar\_set}$ (=$P_{cur\_set}$+ΔP), sends out scaling coefficients S11 and S10 to amplitude control circuit 104 and variable amplifier 105, respectively, and controls transmission power of polar modulation transmitter 100.

At this time, as shown in FIG. 8, if operation mode of PA 103 changes between before and after symbol boundary timing TS0, average output power value $P_{tar}$ of PA 103 is calculated in averaging interval ΔT2 after mode changes and transmission power is corrected using average value $P_{cur}$ and $P_{tar}$.

In this way, by calculating the current average output power value of PA 103 before symbol boundary timing TS0 where transmission power control value ΔP is set, when operation mode of PA 103 changes, the timing to end the first correction from symbol boundary timing TS0 comes earlier. Consequently, even when limit is placed on time required for transmission power control as specified according to TS25.101 of 3GPP, it is possible to control transmission power within a limited specified period reliably.

If transmission control is performed using only the measurement value of output power in one symbol interval subject to mode change control (i.e. interval from symbol boundary timing TS0 to symbol boundary timing TS1), it is necessary to, first, measure power before mode changes, within the symbol interval subject to mode change control. However, with this embodiment, average output power value $P_{cur}$ measured before symbol boundary timing TS0 is used as output power before mode changes, so that it is possible to perform the mode change by setting target transmission power $P_{tar\_set}(=P_{cur\_set}+\Delta P)$ immediately after symbol boundary timing TS0, and, accompanying this, reduce processing in one symbol interval.

Further, although, with the above example, each average value is calculated using six samples, the timing to complete the first correction comes earlier, so that, even if each average value is calculated using more than six samples, it is possible to complete the first correction within 25 μsec from symbol boundary timing TS0. When the number of samples increases, the accuracy of calculating each average value improves, and, as a result of this, it is possible to improve the accuracy of transmission power control.

Further, if the number of samples for calculating each average value does not change, an average value over six samples can be acquired twice within 25 μsec from symbol boundary timing TS0 in averaging interval ΔT2 and averaging interval ΔT3, so that it is possible to correct transmission power twice. Although the setting error, in which the relative error resulting from drift in sensitivity characteristics of detector 106 is the main component, increases when transmission power control value ΔP is greater, this setting error can be reduced by increasing the number of corrections, so that it is possible to improve the reliability of transmission power levels.

Further, although, with the above example, an average value is calculated using six samples in both averaging intervals ΔT2 and ΔT3 to improve the accuracy of output power control in steps, the number of samples in averaging interval ΔT3 may be increased over the number of samples in averaging interval ΔT2. By this means, averaging interval ΔT2 can be made shorter, so that it is possible to complete transmission power control within shorter time.

Hereinafter, the overall operation of polar modulation transmitter 100 according to this embodiment will be explained with reference to flowcharts.

Figure 9:
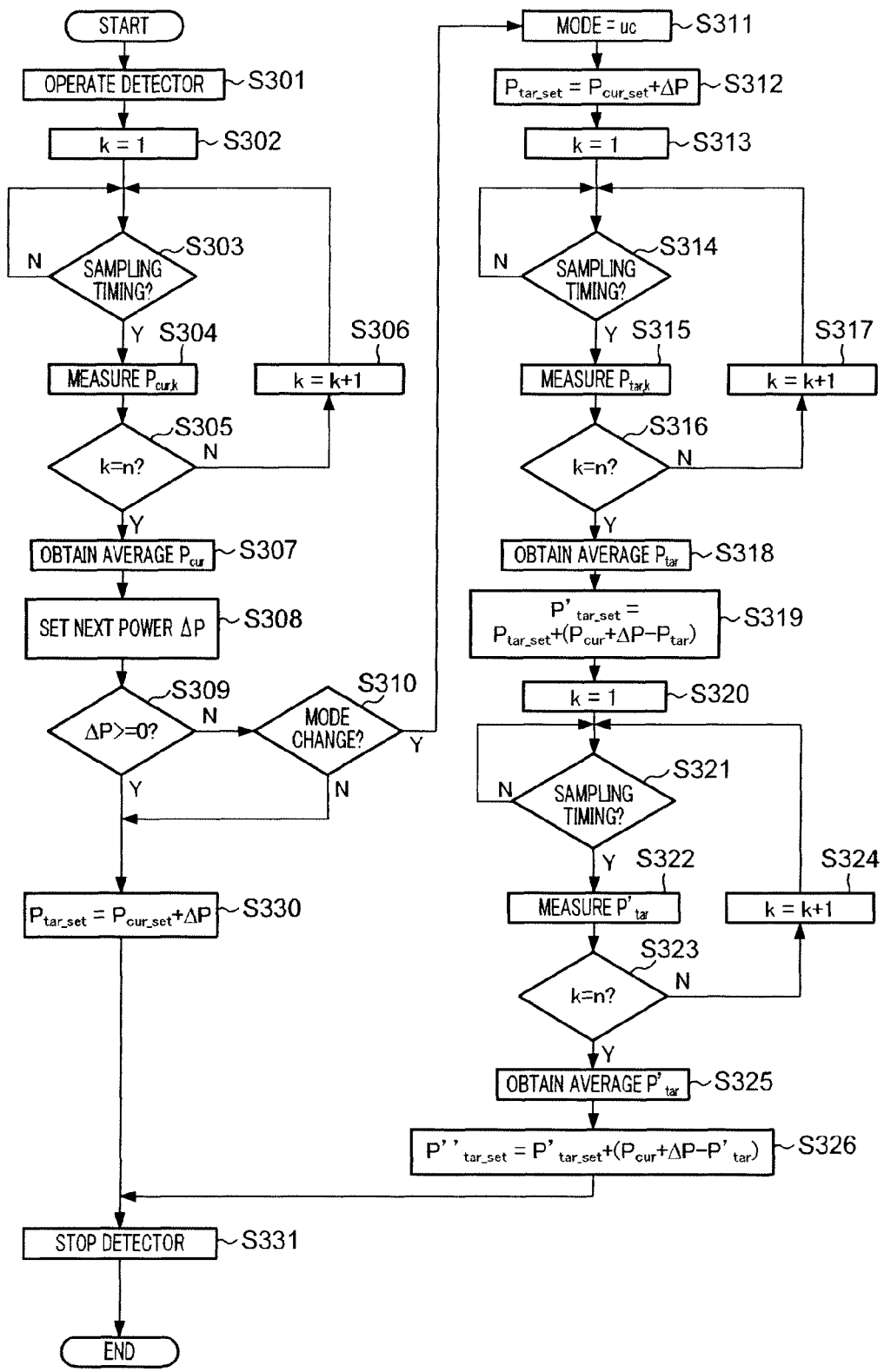
FIG. 9 is a flowchart illustrating the operation of the polar modulation transmitter when current mode is compressed mode.

FIG. 9 is a flowchart illustrating the operation of polar modulation transmitter 100 when current mode is compressed mode. In step S301, transmission power control section 107 turns on the power supply of the measurement system at the timing a predetermined period before the symbol boundary, and measures average output power value $P_{cur}$ of PA 103 in compressed mode to step S303 and step S307.

Transmission power control section 107 sets transmission power value ΔP based on the transmission power control signal reported by a communicating party in step S308, then in step S309 decides whether or not transmission power control value ΔP is zero or more, and if transmission power control value ΔP is zero or more (step S309: "YES"), decides that compressed mode can be performed as is, proceeds to step S330, and changes power by ΔP. On the other hand, if the amount of drift ΔP is less than zero in step S309 (step S309: "NO"), transmission power control section 107 decides whether or not mode is changed to uncompressed mode (step S310), and if it is decided that mode is not changed (step S310: "NO"), proceeds to step S330 and changes power by ΔP.

If, on the other hand, it is decided in step S310 that mode is changed to uncompressed mode (step S310: "YES"), mode is changed to uncompressed mode in step S311. In step 312, by applying transmission power control value ΔP designated by the transmission power control signal, target transmission power $P_{tar\_set}$ is set.

In steps S313 to S318, average output power value $P_{tar}$ of PA 103 in uncompressed mode is measured, and, in step 319, new target transmission power $P'_{tar\_set}$ is set by performing error correction at transmission power control section 107 using average value $P_{cur}$ and average value $P_{tar}$.

Further, in steps S320 to S325, average output power value $P'_{tar}$ of PA 103 in uncompressed mode is measured, and, in step 326, new target transmission power $P''_{tar\_set}$ is set by performing error correction at transmission power control section 107 using average value $P_{cur}$, average value $P'_{tar}$ and target transmission power $P'_{tar\_set}$.

When error correction ends, power supply for the measurement system is turned off in step S331.

Figure 10:
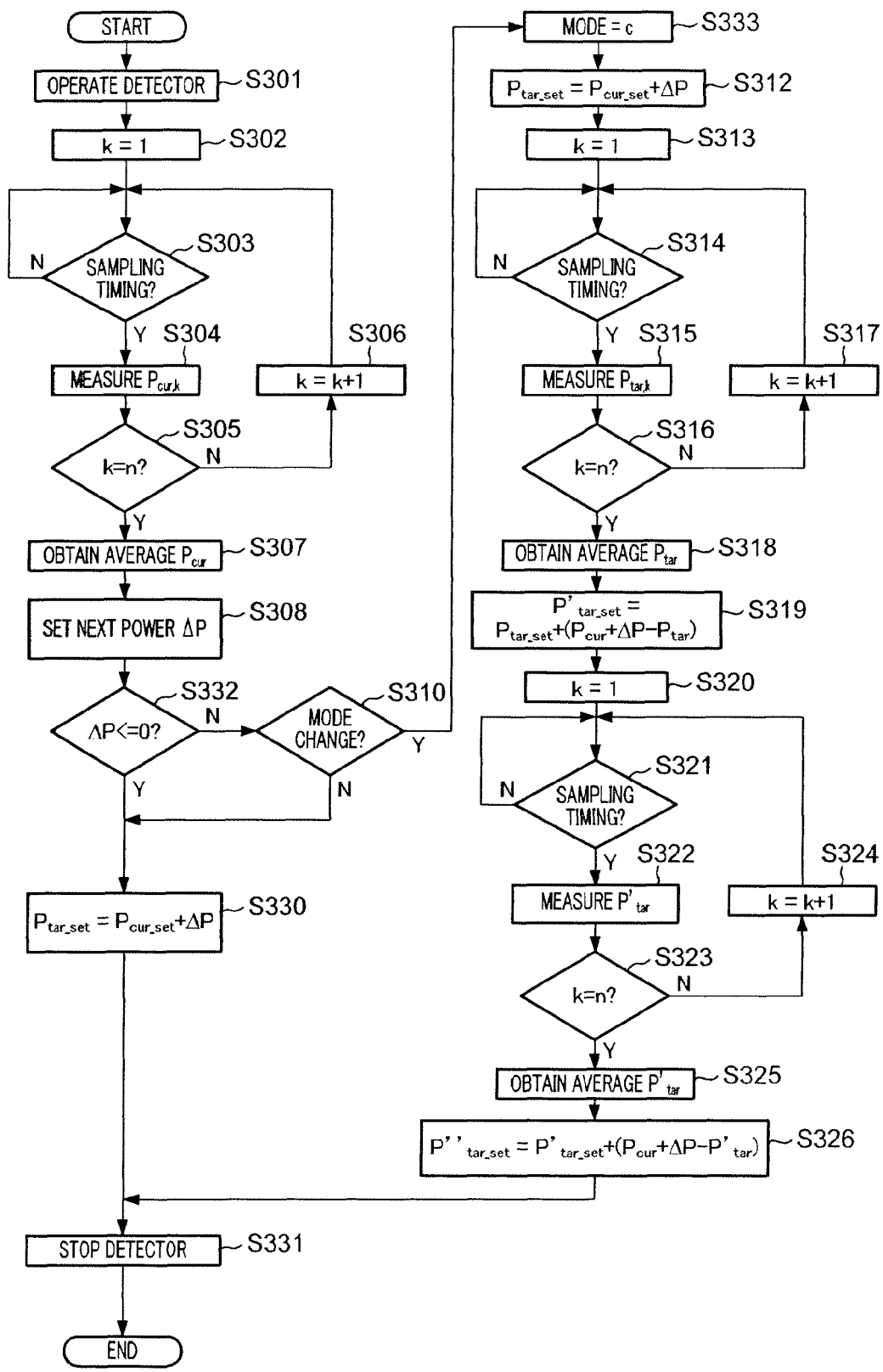
FIG. 10 is a flowchart illustrating the operation of the polar modulation transmitter when current mode is uncompressed mode.

FIG. 10 is a flowchart illustrating the operation of polar modulation transmitter 100 when current mode is uncompressed mode. In FIG. 10, the same steps as in FIG. 9 will be assigned the same reference numbers and repetition of description will be omitted. In FIG. 10, it is decided whether or not transmission power value ΔP is zero or less in step S332 instead of step S309 of FIG. 9, and mode is changed from uncompressed mode to compressed mode in step S333 instead of step S311 of FIG. 9.

As described above, according to this embodiment, by starting detection of output power of PA 103 in advance before the symbol boundary where transmission power control value ΔP is set and before mode changes, based on transmission power control signals and correcting transmission power output based on the amount of drift in output power of PA 103 between before and after mode changes, it is possible to make the timing to end correcting transmission power come earlier from the symbol boundary as a reference, compared to the case where detection of output power of PA 103 is started between after the symbol boundary where transmission power control value ΔP is set and before mode changes. Consequently, even when limit is placed upon time to complete transmission power control, it is possible to control transmission power within a limited specified period reliably.

Further, the number of samples used to detect the amount of drift can be increased, and so the accuracy of detecting the amount of drift improves, so that it is possible to improve the reliability of transmission power levels.

Further, the timing to complete transmission power correction comes earlier, and, as a result, transmission power control section 107 is able to re-correct output power of PA 103 within the specified period based on the amount of drift in output power of PA 103 between before and after correction is performed, so that it is possible to improve the accuracy of transmission power control.

Embodiment 2

The hardware configuration diagram of the transmission apparatus according to Embodiment 2 of the present invention is the same as in FIG. 6, and so repetition of explanation will be omitted.

Transmission power control section 107 forces the mode change using transmission power control value ΔP=0, before the symbol boundary where transmission power control value ΔP is set based on transmission power control signals, detects the amount of drift in output power of PA 103 before and after mode changes using average value $P_{cur}$ before the symbol boundary where transmission power value ΔP is set and before mode changes, and average value $P_{tar}$ before transmission power value ΔP is set and after mode changes, and, after transmission power control value ΔP is set, corrects target transmission power $P_{tar\_set}$ based on transmission power control value ΔP and the amount of drift.

Figure 11:
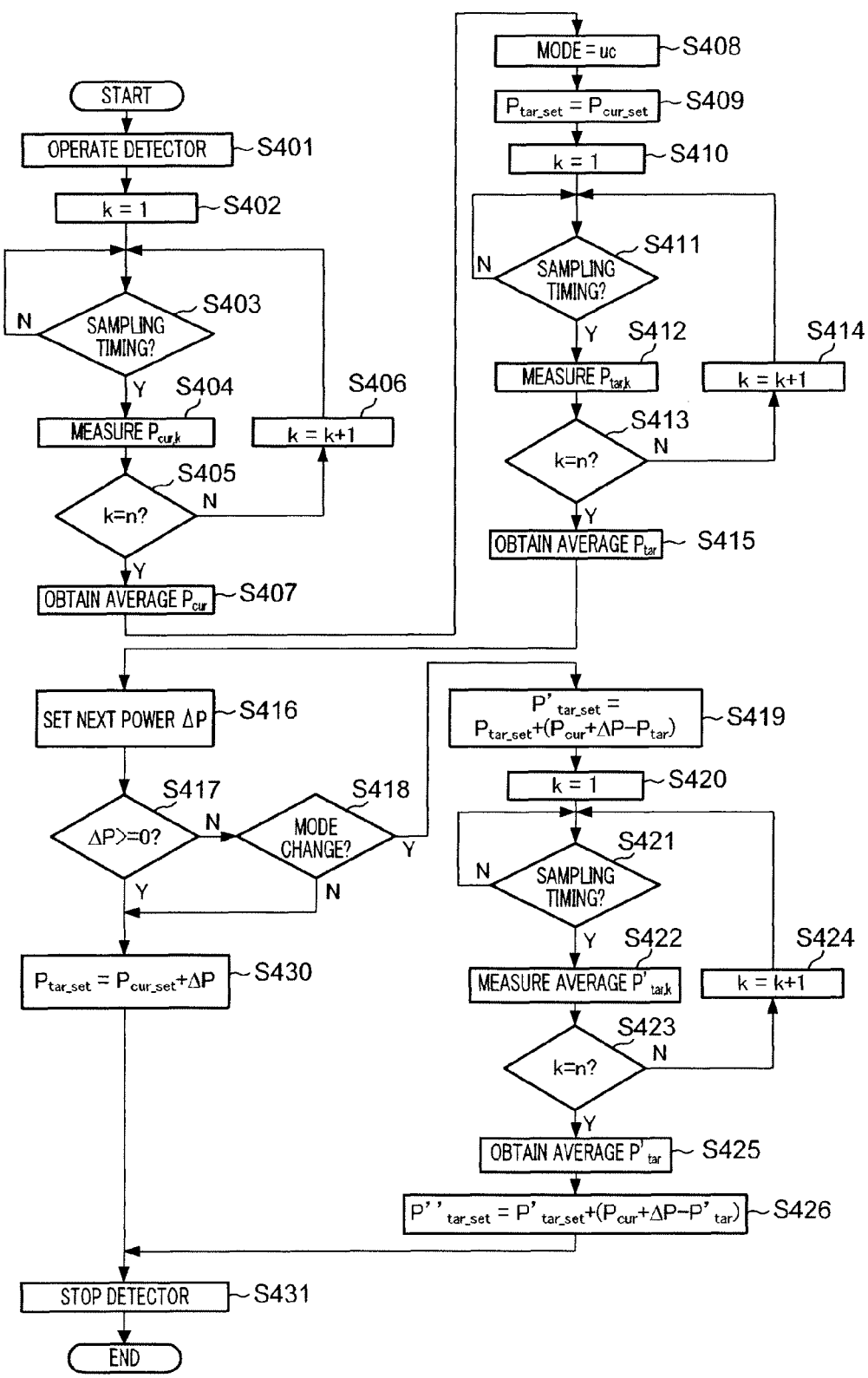
FIG. 11 is a flowchart illustrating the operation of the polar modulation transmitter when current mode is compressed mode.

FIG. 11 is a flowchart illustrating the operation of polar modulation transmitter 100 when current mode is compressed mode.

Transmission power control section 107 turns on the power supply for the measurement system at a timing a predetermined period before symbol boundary timing TS0 in step S401, and measures average output power value $P_{cur}$ in compressed mode in step 402 to step 407.

Further, in step S408, mode is changed from compressed mode to uncompressed mode, and, in step S409, by applying transmission power value ΔP designated by the transmission power control signal, target transmission power $P_{tar\_set}$ is set.

Then, in steps S410 to S415, transmission power control section 107 measures average output power value $P_{tar}$ in compressed mode before the symbol boundary where transmission power control value ΔP is set, and proceeds to step S416.

Transmission power control section 107 sets transmission power control value ΔP according to the transmission power control signal reported by a communicating party in step S416, then in step S417 decides whether or not transmission power control value ΔP is zero or more, and if the amount of drift ΔP is zero or more (step S417: "YES"), decides that compressed mode can be performed as is, proceeds to step S430, and changes power by ΔP. On the other hand, if the amount of drift ΔP is less than zero in step S417 (step S417: "NO"), transmission power control section 107 decides whether or not mode is changed to uncompressed mode (step S418), and if it is decided that mode is not changed (step S418: "NO"), proceeds to step S330 and changes power by ΔP.

If, on the other hand, it is decided that mode is changed to uncompressed mode (step S418: "YES"), transmission power control section 107 performs error correction and sets target transmission power P'$_{tar\_set}$.

In steps S420 to S425, average output power value P'$_{tar}$ of PA 103 of after the error correction in uncompressed mode is measured, and, in step 426, new target transmission power P''$_{tar\_set}$ is set by performing error correction again at transmission power control section 107 using average value $P_{cur}$, average value P'$_{tar}$ and new target transmission power P''$_{tar\_set}$.

When error correction ends, power supply for the measurement system is turned off in step S431.

Figure 12:
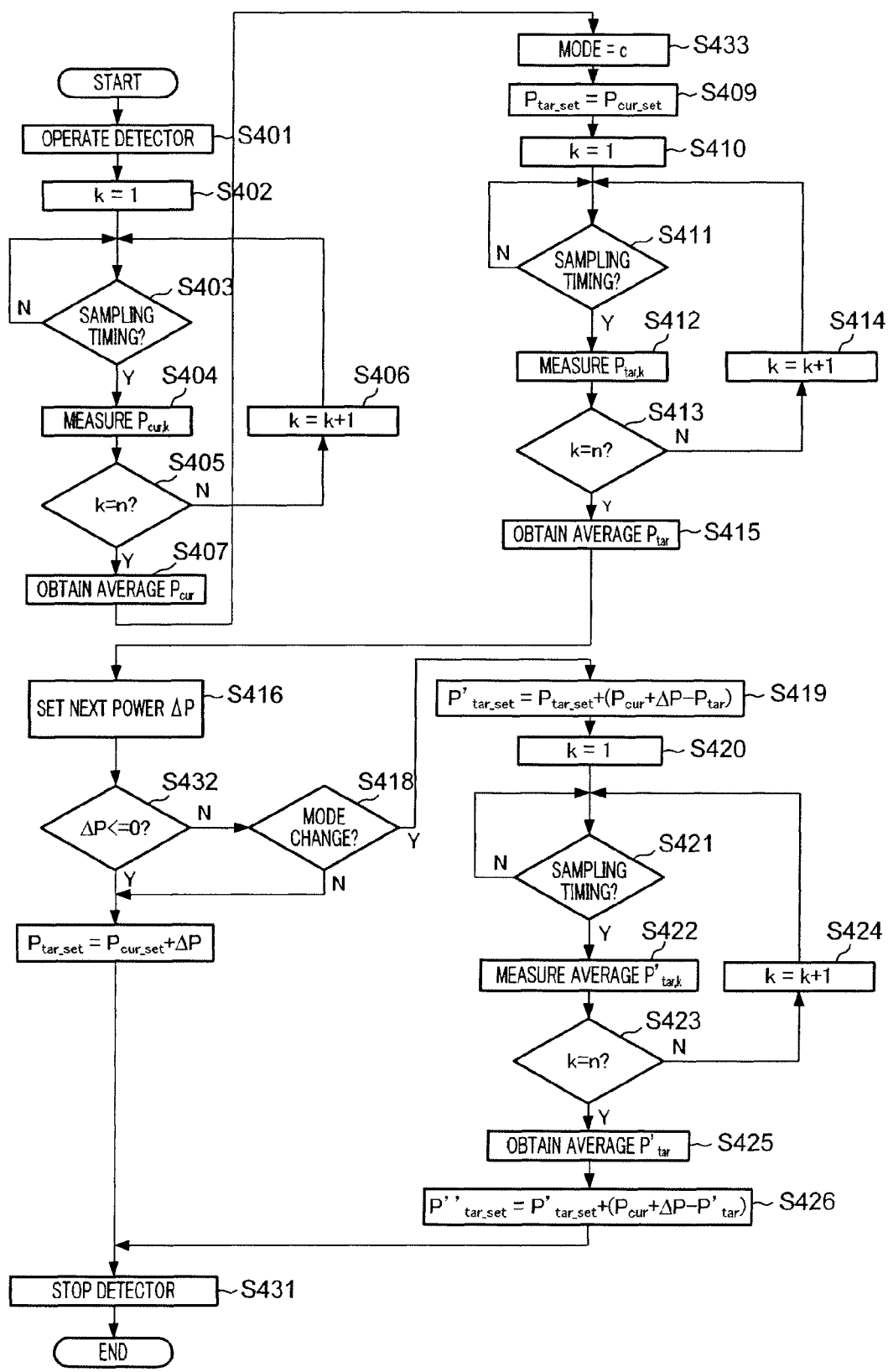
FIG. 12 is a flowchart illustrating the operation of the polar modulation transmitter when current mode is uncompressed mode.

FIG. 12 is a flowchart illustrating the operation of polar modulation transmitter 100 when the current mode is uncompressed mode. In FIG. 12, the same steps as in FIG. 11 will be assigned the same reference numbers and repetition of description will be omitted. In FIG. 12, in step S433, mode is changed from uncompressed mode to compressed mode instead of step S408 of FIG. 11, and, in step S432, whether or not transmission power value ΔP is zero or less is decided instead of step S417 of FIG. 11.

As described above, transmission power control section 107 controls a mode change at PA 103 before the symbol boundary where transmission power control value ΔP is set, and detects the amount of drift in output power of PA 103 before and after mode changes using the detection result of output power of PA 103 before the symbol boundary where transmission power control value ΔP is set and before mode changes and the detection result of output power of PA 103 before the symbol boundary where transmission power control value ΔP is set and after mode changes, so that it is possible to make the timing to complete transmission power correction come earlier from the symbol boundary and complete transmission power control within a specified period more reliably.

Further, the number of samples used to detect the amount of drift can be increased, and so the accuracy of detecting the amount of drift improves, so that it is possible to improve the reliability of transmission power levels.

Further, the timing to complete transmission power correction comes earlier, and, as a result, transmission power control section 107 is able to correct output power of PA 103 a plurality of times within a specified period based on the amount of drift in output power of PA 103 between before and after correction is performed, so that it is possible to improve the accuracy of transmission power control.

Further, after transmission power control value ΔP is set, whether or not operation mode of PA 103 is changed is decided, and, only when mode is changed, by detecting output power of PA 103 at detector 106 and correcting transmission power at transmission power control section 107 based on the amount of drift between before and after mode changes, and, when mode is not changed, by stopping the detection of output power of PA 103 and the transmission power correction at detector 106 and transmission power control section 107, respectively, it is possible to reduce power consumption.

Embodiment 3

Figure 13:
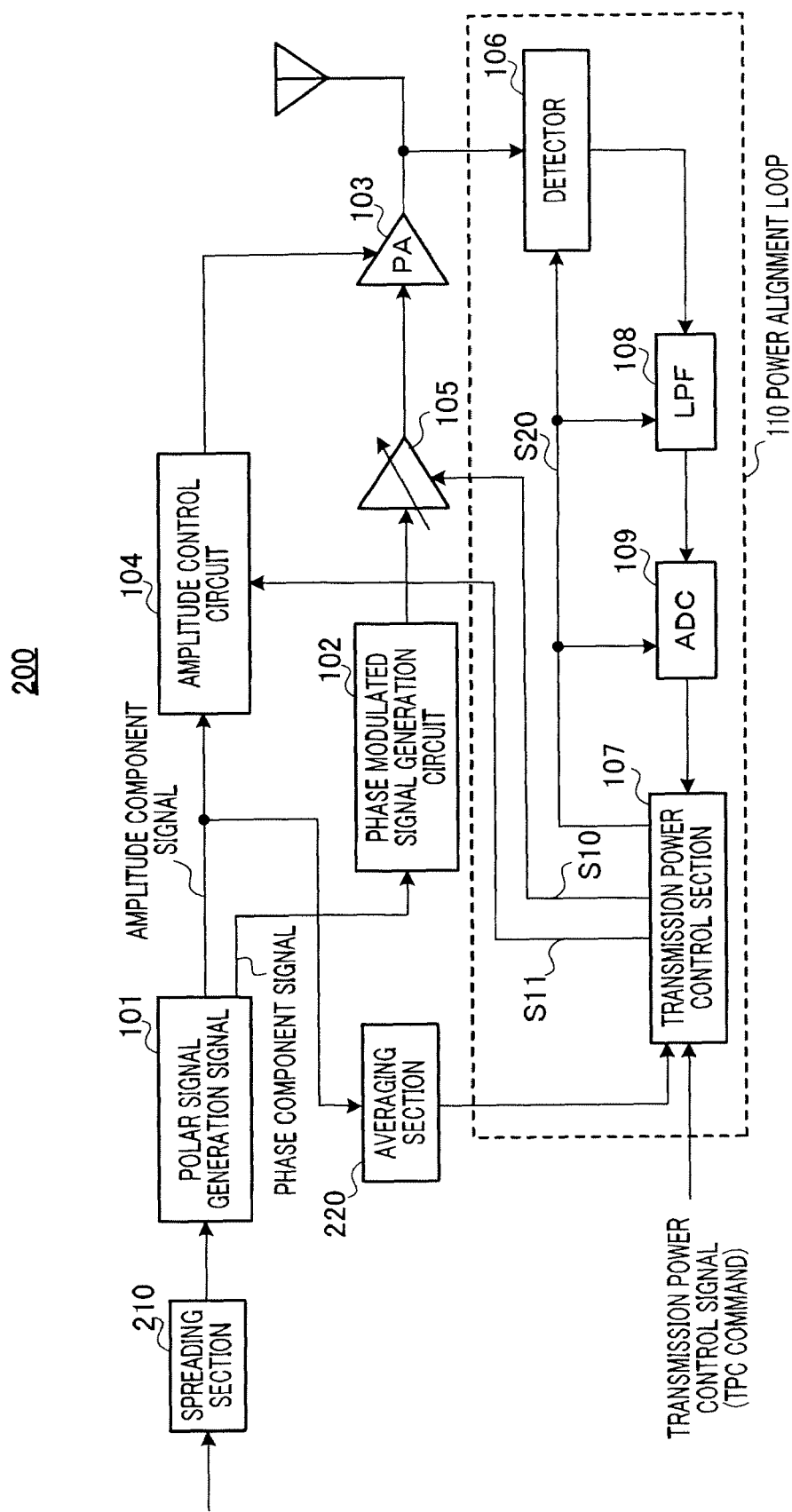
FIG. 13 is a block diagram showing a configuration of the polar modulation transmitter according to Embodiment 3.

FIG. 13 shows a configuration of polar modulation transmitter 200 of this embodiment, and, in this figure, the same components as in FIG. 6 will be assigned the same reference numerals.

Polar modulation transmitter 200 has spreading section 210 and averaging section 220 in addition to the configuration of polar modulation transmitter 100 of FIG. 6.

Spreading section 210 spreads input signals by spreading codes, and outputs the signals to polar signal generation circuit 101. When generating, for example, an HSUPA (High Speed Uplink Packet Access) signal, spreading section 210 multiplies the DPDCH signal, DPCCH signal, HS-DPCCH signal, E-DPDCH signal, and E-DPCCH signal by spreading codes Cd, Cc, Chs, Ced, and Cec, respectively, adjusts gain factors Beta ratio c (Bc), Beta ratio d (Bd), Beta ratio hs (Bhs), Beta ratio ed (Bed), and Beta ratio ec (Bec), generates an HSUPA signal, and outputs the generated HSUPA signal to polar signal generation circuit 101.

Averaging section 220 detects the average output power value of amplitude component signals outputted from polar signal generation circuit 101 in a predetermined period.

Transmission power control section 107 receives an input of output of detector 106 through LPF 108 and ADC 109. Further, transmission power control section 107 also receives inputs of transmission power control signals. Further, transmission power control section 107 receives an input of an average value of the amplitude component signals from averaging section 220.

Based on the amount of drift in the average output power value of PA 103 and the amount of drift in the average output power value of amplitude component signals, transmission power control section 107 finds a power estimation value which eliminate residual drift components resulting from spreading modulation from the average output power value of PA 103. Then, transmission power control section 107 controls transmission power by determining the set target value for transmission power of polar modulation transmitter 200 based on the transmission power control signal and the power estimation value which eliminates residual drift components resulting from spreading modulation.

The relationship between the average output power value of PA 103 and the average output power value of amplitude component signals, and the method of determining power estimation values which eliminate residual drift components resulting from spreading modulation from the average output power value of PA 103 will be explained later.

Transmission power control section 107 calculates final scaling coefficients S10 and S11 by using the original values of scaling coefficients obtained by referring to the table using the transmission power control signals (for example, TPC commands) as addresses, and the correction values of scaling coefficients obtained from the power estimation values which eliminate residual drift components resulting from spreading modulation.

Polar modulation transmitter 200 according to this embodiment finds the power estimation value which eliminates residual drift components resulting from spreading modulation from the average output power value of PA 103, based on the amount of drift in the average output power of PA 103 and the amount of drift in the average output power value of amplitude component signals, determines the set target value for transmission power based on this power estimation value and the transmission power control signal and controls transmission power, so that it is possible to eliminate the influence of residual drift components and control transmission power, and, consequently, improve the accuracy of transmission power control.

Next, how residual drift components are eliminated will be explained in detail.

First, the relationship between the average output power value of PA 103 and the average output power value of amplitude component signals will be explained with reference to FIG. 14 and FIG. 15.

Figure 14:
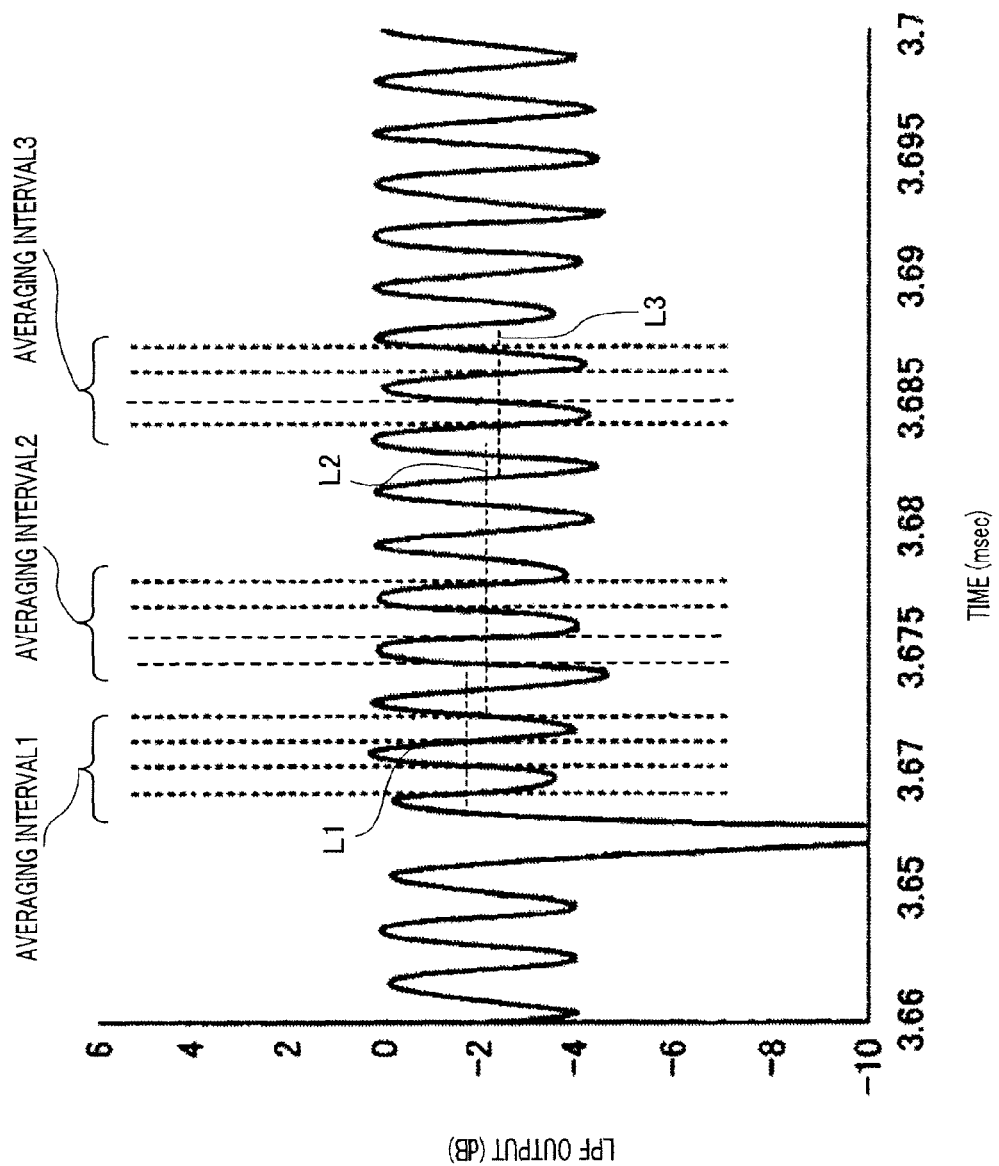
FIG. 14 illustrates drift in an ADC output power average value.

FIG. 14 shows the relationship between the output waveform (which is the solid line in FIG. 14) of LPF 108, the sampling timings (which is vertical dotted lines in FIG. 14) of ADC 109 and the average sampling values (which is horizontal dotted lines in FIG. 8) in a predetermined period. FIG. 15 shows the power waveforms of amplitude component signals (i.e. AM path signal) and short-term average values. FIG. 14 and FIG. 15 show waveforms when there is no influence due to transmission power changes and device characteristics.

Figure 15:
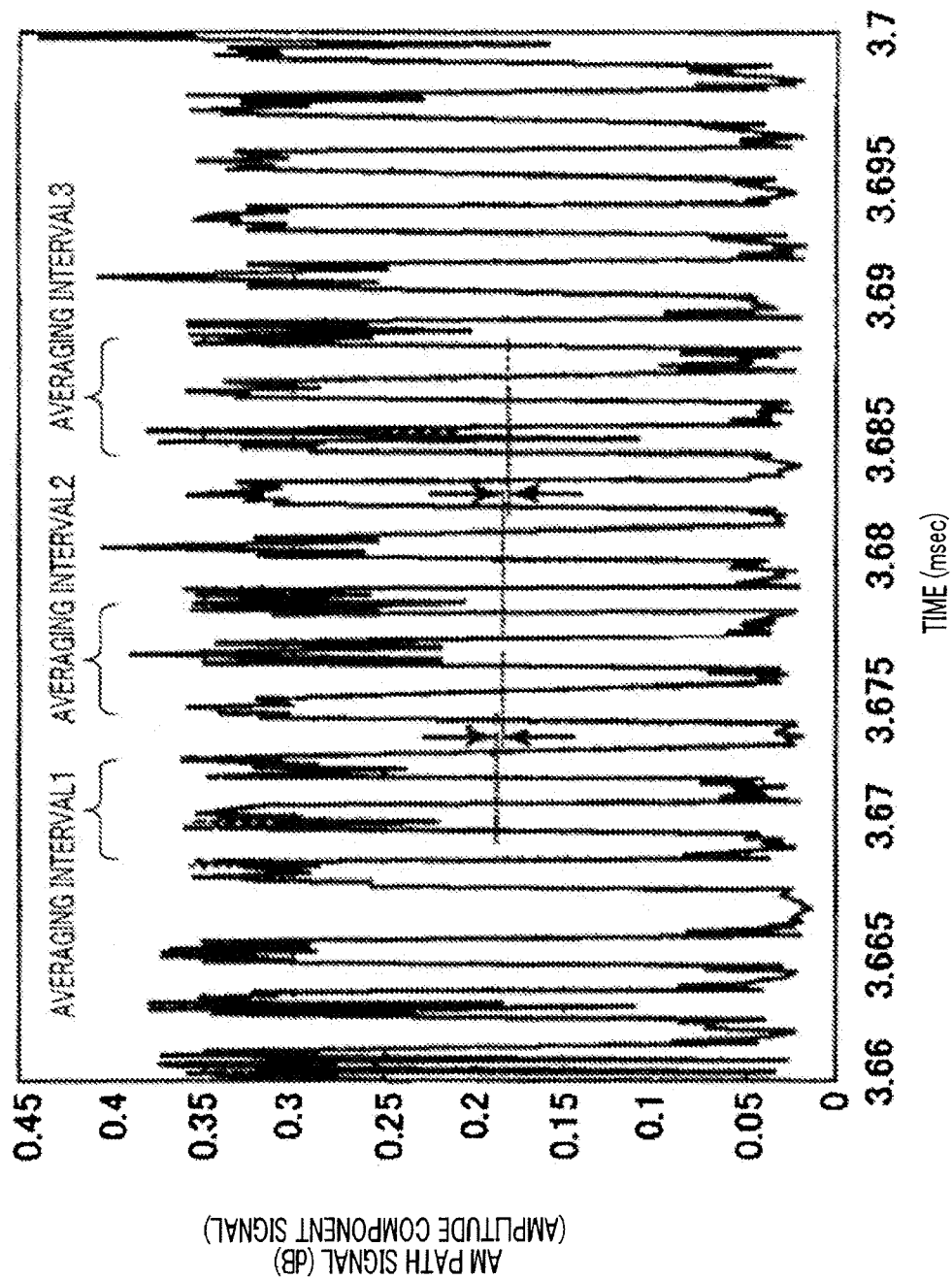
FIG. 15 illustrates drift in an average output power value of amplitude component signals.

In this case, although the scale difference and noise influence occurs depending on the circuit configuration of detector 106, output of detector 106 is substantially the same as the waveform pattern of amplitude component signals (i.e. AM path signal) shown by solid lines in FIG. 15. To be more specific, the output voltage of detector 106 drifts periodically between near 0 [V] and near 0.35 [V]. The periodicity of output voltage drift of this detector 106 results from the fundamental period of the spread modulated signal resulting from the pattern of the spreading code used at spreading section 110. If the fundamental period of the spreading code shows, for example, an eight chip period, the period of output voltage drift of detector 106 shows an eight chip period (that is, values are near 0 [V] for a four chip period and values are near 0.35 [V] for the next four chip period) or a four chip period, which is half of an eight chip period. Further, if the fundamental period of the spreading code shows, for example, a four chip period, the period of output voltage drift of detector 106 shows a four chip period (that is, values are near 0 [V] for a two chip period and values are near 0.35 [V] for the next two chip period) or a two chip period, which is half of a four chip period.

As shown in FIG. 14, an output signal of LPF 108 shows drift of around 4 dB width, and shows drift of 10 dB or greater near 3.66 msec (i.e. symbol boundary) in FIG. 14. This drift deteriorates the accuracy of power control, and so these drift components are eliminated in this embodiment.

Transmission power control section 107 of this embodiment averages samplings value at time positions avoiding timings of significant drift of around 3.66 msec (i.e. symbol boundary) in FIG. 14. In practice, transmission power control section 107 does not perform averaging until a settling period passes from the symbol boundary (i.e. the period until output of LPF 108 becomes stable), and performs averaging using the LPF output after the setting period passes.

Further, the sampling period of ADC 109 is set so as to match with the above drift of around 4 dB. Transmission power control section 107 is able to eliminate the influence of significant drift near the symbol boundaries and drift of around 4 dB width by averaging ADC values of a number of samples at positions not including the symbol boundaries.

However, transmission power control section 220 is not able to eliminate drift components of much lower frequencies. In FIG. 14, the vertical dotted lines show sampling timings in periods of integral multiples of drift of around 4 dB (i.e. 960 kHz), and the horizontal dotted lines show average values of four samples. Average value L1 in averaging interval 1, average value L2 in averaging interval 2 and average value L3 in averaging interval 3 are all different, which shows that drift components are not yet eliminated. These little drift components are referred to as "residual drift components."

The inventors focus upon amplitude component signals to eliminate residual drift components. FIG. 15 shows amplitude component signals (AM path signal), the horizontal axis shows time and the vertical axis shows instantaneous power. Values obtained by averaging amplitude component signals in averaging intervals 1, 2 and 3 matching with averaging intervals 1, 2 and 3 of FIG. 14 are shown by horizontal dotted lines to show clearly whether or not the above residual drift components are included in these amplitude component signals.

Figure 16:
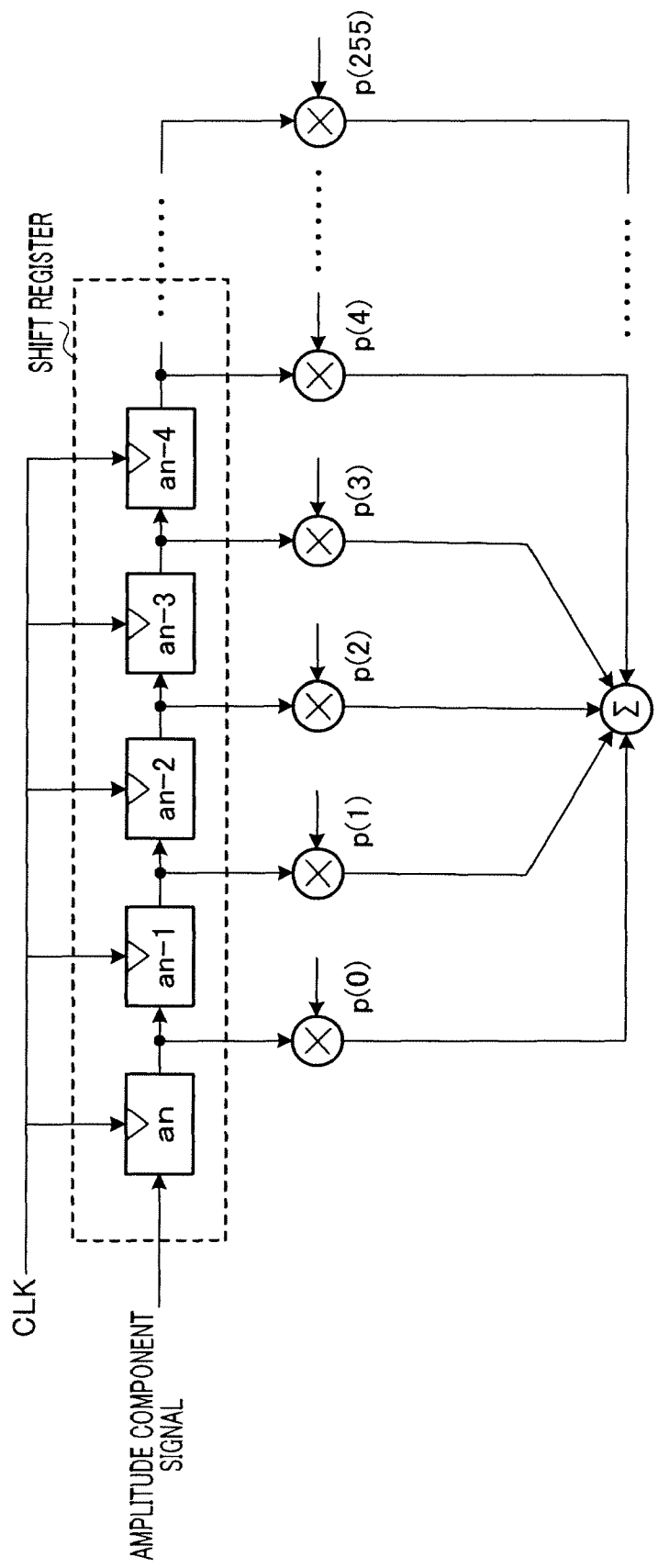
FIG. 16 is a connection diagram showing an FIR filter as a configuration example of an averaging section.

Here, any circuit may be used to average amplitude component signals, and, for example, an FIR filter, IIR filter or adder for performing addition only in required intervals may be used. For example, the FIR filter shown in FIG. 17 and the IIR filter shown in FIG. 18 may be used as averaging section 220. FIG. 16 shows an example where an FIR filter is used, whereby the number of taps is two hundred fifty six and all tap coefficients p(0) to p(255) are set to one.

Here, the number of taps may be determined from the sampling frequency for amplitude component signals, the sampling period in ADC 109 and the number of averaged samples in ADC 109, to match with the interval of four samples in ADC 109 explained in FIG. 14. As an example, when the sampling frequency for the amplitude component signals is 61.44 MHz, the sampling period in ADC 109 is 960 kHz and the number of averaged samples in ADC 109 is four, the number of taps at the FIR filter is determined by the following equation.

(Number of taps at the FIR)=(number of averaged samples in the ADC)×(sampling frequency for amplitude component signals)/(sampling frequency of the ADC)=4×61.44MHz/960kHz=256

Further, the sampling frequency for amplitude component signals is 61.44 MHz, and so, when the number of taps at FIR filter is two hundred fifty six, clock frequency CLK of the FIR filter may be set to 61.44 MHz.

By the way, the multiplier for the FIR filter occupies a large setup area on the substrate, and so reducing the number of taps is a common object for ones skilled in the art. However, the filter coefficients multiplied at the multiplier may all be set to one, so that the FIR filter may be configured with adders. For this reason, even if the number of taps increases, the setup area does not increase significantly.

Figure 17:
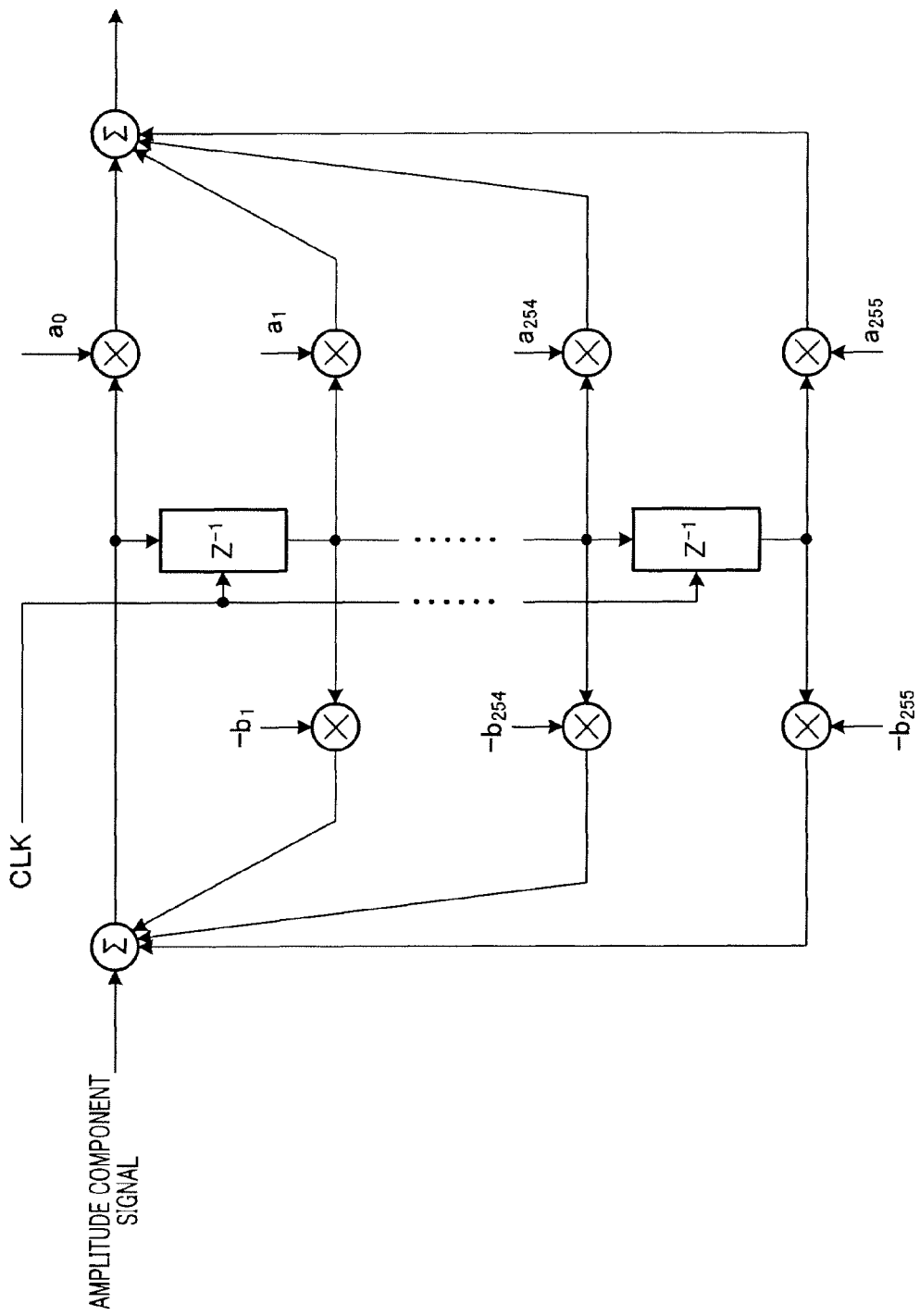
FIG. 17 is a connection diagram showing an IIR filter as a configuration example of the averaging section.

FIG. 17 shows a configuration example of using an IIR filter instead of the FIR filter of FIG. 16. In FIG. 17, for example, clock frequency CLK may be set to the same 61.44 MHz similar to the sampling frequency for the amplitude component signal as in FIG. 16, feedforward coefficients a0 to a255 may be set to one, and feedback coefficients b1 to b255 may be set to 255/256. Here, these setting values are examples and are not limited to these.

As shown in FIG. 15, average values in averaging intervals 1, 2 and 3 show little drift between averaging intervals 1, 2 and 3. FIG. 15 shows a waveform free of such influences as device variations, and so drift in the average value results from drift components included in amplitude component signals themselves. These drift components include wideband drift components in amplitude component signals after spreading modulation depending on a spreading pattern or a spreading code gain factor, and drift in the low-frequency component cannot be eliminated by short-term averaging.

Consequently, even if there is no influence due to device characteristics, the average output power value of PA 103 within a predetermined period after the LPF drifts depending on the averaging interval as shown in FIG. 14.

Correlation between residual drift components included in the above average value after the LPF and residual drift components included in amplitude component signals will be explained later. Although characteristics of specific symbols are focused upon in the above description, characteristics including characteristics of other symbols over one frame will be focused upon, and residual drift components included in the average value after the LPF and residual drift components included in amplitude component signals will be compared.

Figure 18:
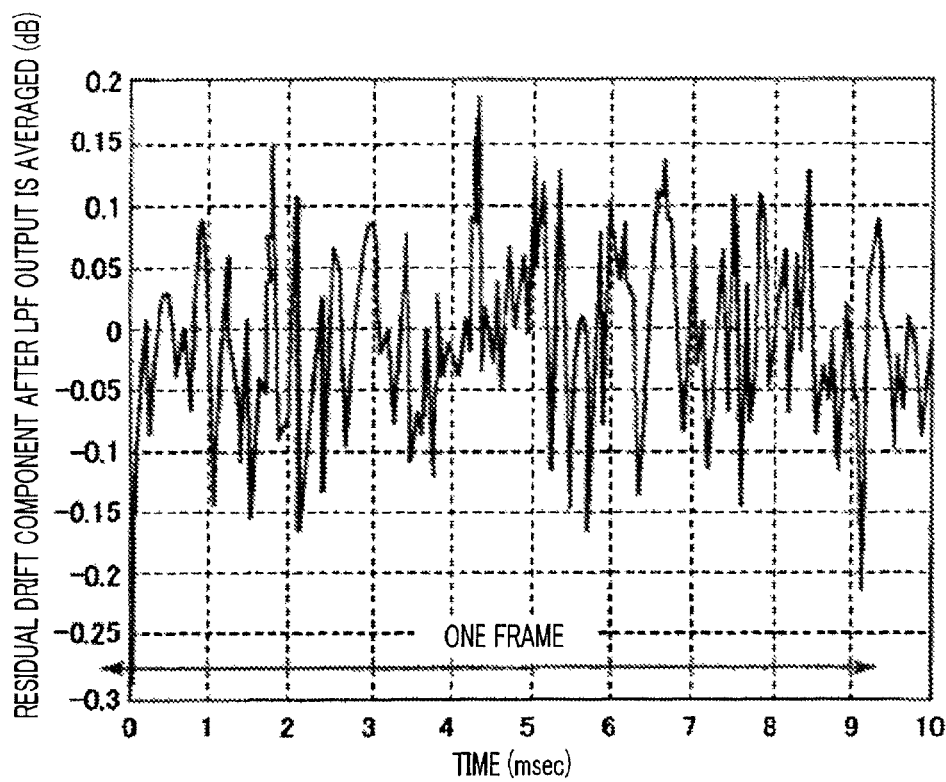
FIG. 18 shows how the average output power value of a PA drifts over one frame in a specific interval of each symbol.

In FIG. 18, the residual drift components between average value L1 of LPF outputs of symbols in the first ADC sampling interval (for example, averaging interval 1 of FIG. 14) and average value L2 in the second ADC sampling interval (for example, averaging interval 2 of FIG. 14) are extracted over one frame, and the horizontal axis is the symbol position in one frame and the vertical axis is the magnitude of residual drift components.

Figure 19:
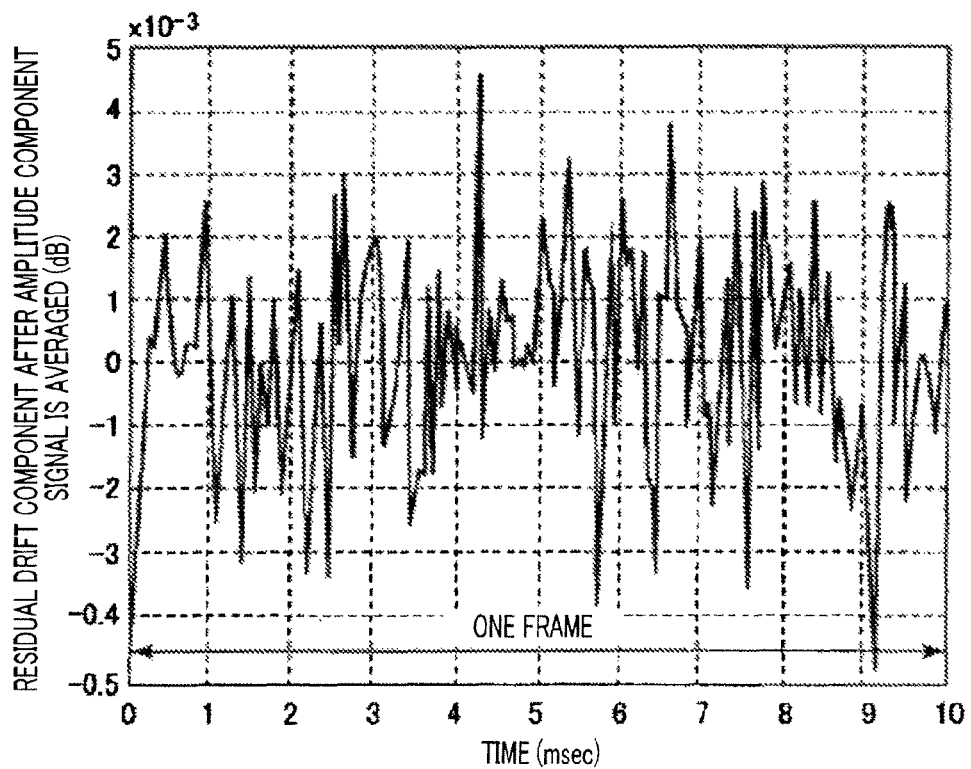
FIG. 19 shows how the average output power value of amplitude component signals drifts over one frame in a specific interval of each symbol.

In FIG. 19, the residual drift components between the average value of amplitude component signals of symbols in the first averaging interval (for example, averaging interval 1 of FIG. 15) and the average value in the second averaging interval (for example, averaging interval 2 of FIG. 15) are extracted over one frame, and the horizontal axis is the symbol position in one frame and the vertical axis is the magnitude of the residual drift components.

In these figures, residual drift components included in the average value after the LPF and residual drift components included in amplitude component signals show similar characteristics at the same symbol positions, and so correlation is anticipated to hold between the residual drift components.

Figure 20:
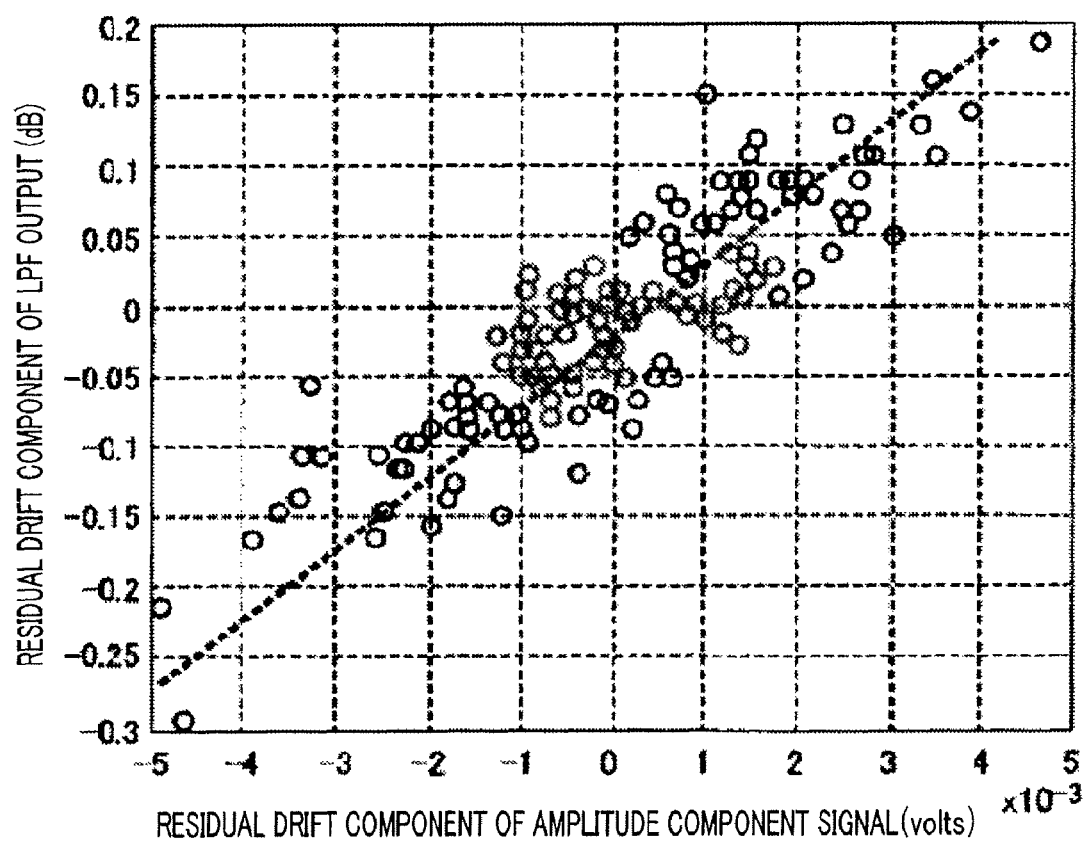
FIG. 20 illustrates correlation between drift in the average value of LPF output waveforms and drift in the average value of amplitude component signals.

In FIG. 20, residual drift components included in the amplitude component signals of symbols are plotted on the horizontal axis and residual drift components included in the average value after the LPF are plotted on the vertical axis over one frame. Here, although the distribution of plots is random if there is no correlation between the residual drift components, plots are distributed in FIG. 20 near the straight line with a certain inclination, and so there is correlation between two residual drift components.

The correlation coefficient in this case is represented by "C," and correlation coefficient C is determined by finding the inclination of the straight line where plots in FIG. 20 approximate a straight line, according to the following equation.

Correlation coefficient C=(the amount of change in residual drift components included in the average value after the LPF)/(the amount of change in residual drift components included in amplitude component signals)

That is, by finding this correlation coefficient C using simulation or a known signal interval, residual drift components (i.e. the difference between average values obtained at averaging section 220) are determined based on amplitude component signals and are multiplied by correlation coefficient C, so that it is possible to estimate residual drift components included in the average value after the LPF.

In this way, it is possible to find a power estimation value which eliminates the influence of residual drift components, by subtracting the estimated value of residual drift components included in the above average value after the LPF from the amount of drift in the average output power value of PA 103.

That is, transmission power control section 107 calculates final scaling coefficients S10 and S11 using the original values of scaling coefficients obtained by referring to a table using transmission power control signals as addresses and the correction values of scaling coefficients obtained from the result of subtracting a value obtained by multiplying the amount of drift in the average output power value of amplitude component signals by correlation coefficient C, from the amount of drift in the average output power value of PA 103 (that is, the power estimation value which eliminates the residual drift components resulting from spreading modulation).

Figure 21:
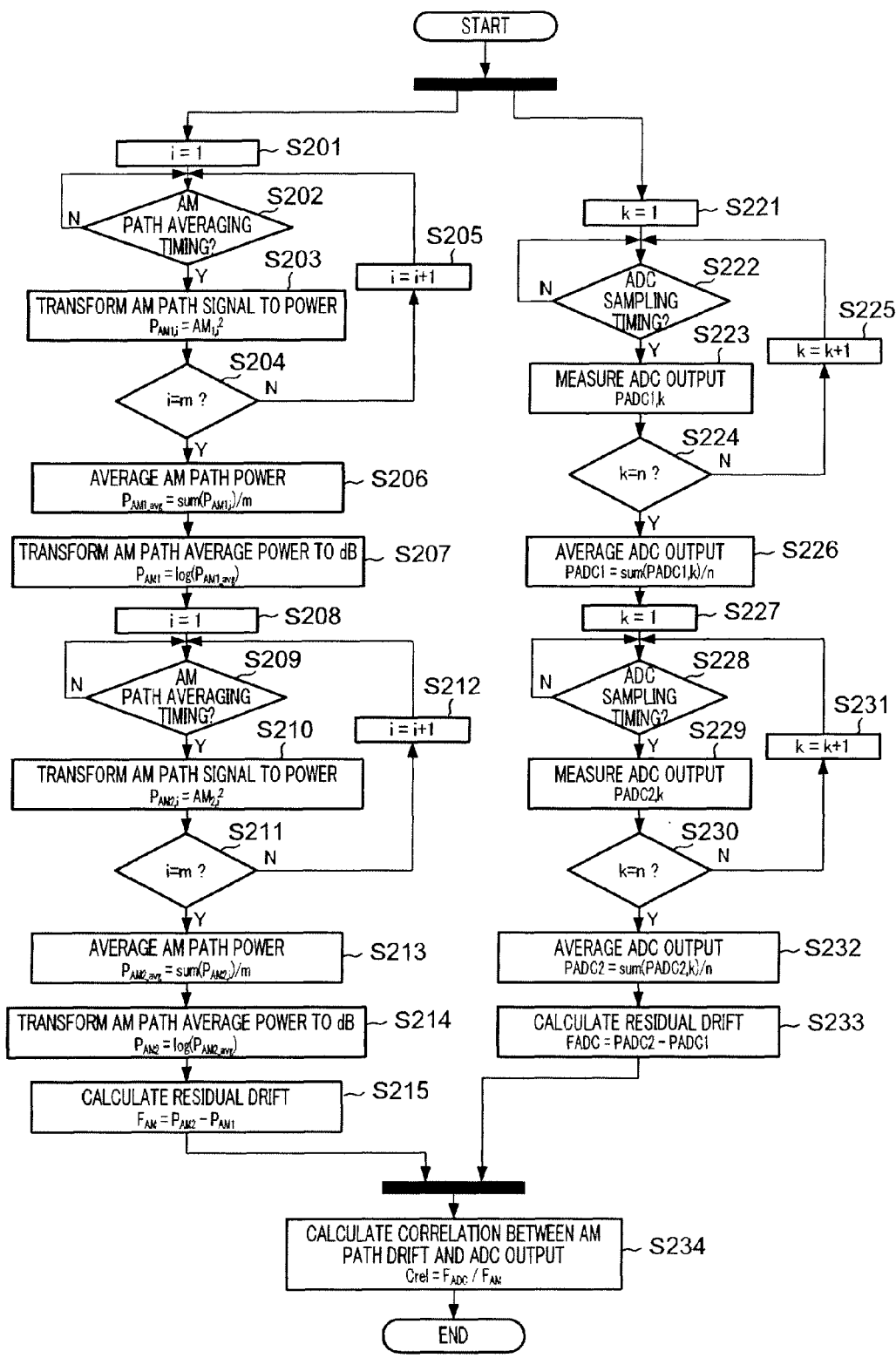
FIG. 21 is a flowchart illustrating a calculation method of calculating correlation between drift in the average value of LPF output waveforms and drift in the average value of amplitude component signals.

FIG. 21 is a flowchart showing an example of a method for calculating correlation coefficient C.

In steps S201 through S206, average output power value $P_{AM1\_avg}$ of amplitude component signals (i.e. AM path) outputted from polar signal generation circuit 101 is calculated within a predetermined period, and the output power unit is converted to dB using the equation $\log(P_{AM1\_avg})=P_{AM1}$. Further, in the case of the above example, parameter m in FIG. 21 is set to "256," and parameter n is set to "4."

Similarly, in steps S208 to S213, average output power value $P_{AM2\_avg}$ of amplitude component signals outputted from polar signal generation circuit 101 is calculated, and the output power unit is converted to a logarithm using the equation $\log(P_{AM2\_avg})=P_{AM2}$ in step S214. In step S215, residual drift components $F_{AM}$ of amplitude component signals outputted from polar signal generation circuit 101 are calculated by subtracting $P_{AM1}$ from $P_{AM2}$.

In steps S221 to S226, average value $P_{ADC1}$ of output results of ADC 109 within a predetermined period is measured, and, similarly, in steps S227 to S232, average value $P_{ADC2}$ of output results of ADC 109 within a predetermined period is measured. In step S233, residual drift components $F_{ADC}$ are calculated by subtracting $P_{ADC1}$ from $P_{ADC2}$. In LPF 108 and ADC 109, the output power unit is converted to a logarithm, and so no steps matching with step S207 and step S214 are provided with respect to $P_{ADC1}$ and $P_{ADC2}$, and in step S233, residual drift components $F_{ADC}$ are calculated by subtracting $P_{ADC1}$ from $P_{ADC2}$.

Finally, in step S234, correlation coefficient C is calculated by dividing residual drift components $F_{ADC}$ by residual drift components $F_{AM}$.

With regard to correlation coefficient C, a single common coefficient may be provided for all combinations of gain factors Beta ratio c (Bc), Beta ratio d (Bd), and Beta ratio hs (Bhs) when the DPDCH signal, DPCCH signal, and HS-DPCCH signal forming an HSUPA signal are multiplied by spreading codes, or a plurality of correlation coefficients C may be provided according to the combination of gain factors. It is also possible to change conditions such as the plurality of symbols, the plurality of the combinations of gain factors, or the averaging intervals within symbols, calculate correlation coefficient C under various conditions, and use the average value as correlation coefficient C.

Transmission power control section 107 controls transmission power of polar modulation transmitter 100 based on a transmission power control command, the amount of drift in the average output power value of PA 103, and the amount of drift in the average output power value of amplitude component signals.

Next, the operation of polar modulation transmitter 200 with the above configuration will be explained with reference to FIG. 22.

Figure 22:
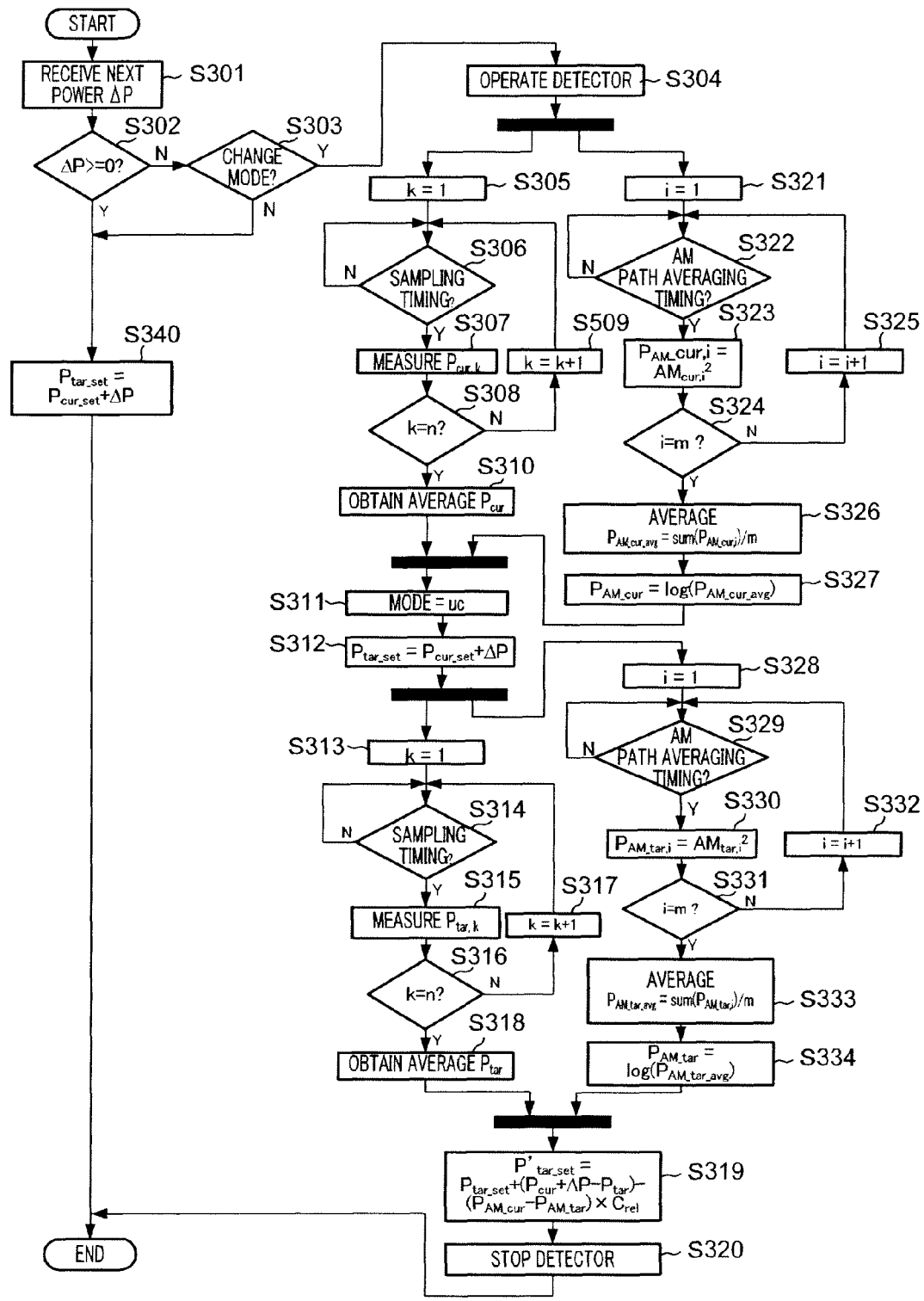
FIG. 22 is a flowchart illustrating the operation of the polar modulation transmitter when current mode is compressed mode.

FIG. 22 is a flowchart illustrating the operation of polar modulation transmitter 200 when current mode is compressed mode. Polar modulation transmitter 200 detects the amount of power drift ΔP designated by a communicating party (not shown) in step S301, then in step S302 decides whether or not the amount of drift ΔP is zero or more, and if the amount of drift ΔP is zero or more (step S302: "YES"), decides that compressed mode can be performed as is, proceeds to step S340, and changes power by ΔP. On the other hand, if the amount of drift ΔP is less than zero in step S302 (step S302: "NO"), polar modulation transmitter 200 decides whether or not mode is changed to uncompressed mode (step S303), and if it is decided that mode is not changed (step S303: "NO"), proceeds to step S340 and changes power by ΔP.

If, on the other hand, it is decided in step S303 that mode is changed to uncompressed mode (step S303: "YES"), transmission power control section 107 decides that feedback control at power alignment loop 110 is necessary, and proceeds to step S304. Polar modulation transmitter 200 turns on the power supply for the measurement system in step S304, and proceeds to step S305 and step S321.

In steps S305 to S310, average output power value $P_{cur}$ of PA 103 in compressed mode is measured, in step S311, mode is changed from compressed mode to uncompressed mode, and, in step S312, power is changed by ΔP.

Then, in steps S313 to S318, output power average value $P_{tar}$ of PA 103 in uncompressed mode is measured.

Meanwhile, in steps S321 to S327, average output power value $P_{AM\_cur}$ of amplitude component signals outputted from polar signal generation circuit 101 in compressed mode period is measured. In step S311, mode is changed from compressed mode to uncompressed mode, and, in step S312, power is changed by ΔP. Then, in steps S328 to S334, average output power value $P_{AM\_tar}$ of amplitude component signals outputted from polar signal generation circuit 101 in uncompressed mode period is measured.

In step S319, transmission power control section 107 performs error correction using $P_{cur}$, $P_{tar}$, $P_{AM\_cur}$, $P_{AM\_tar}$, and correlation coefficient C, and calculates $P'_{tar\_set}$. When error correction ends, power supply for the measurement system is turned off in step S320.

Figure 23:
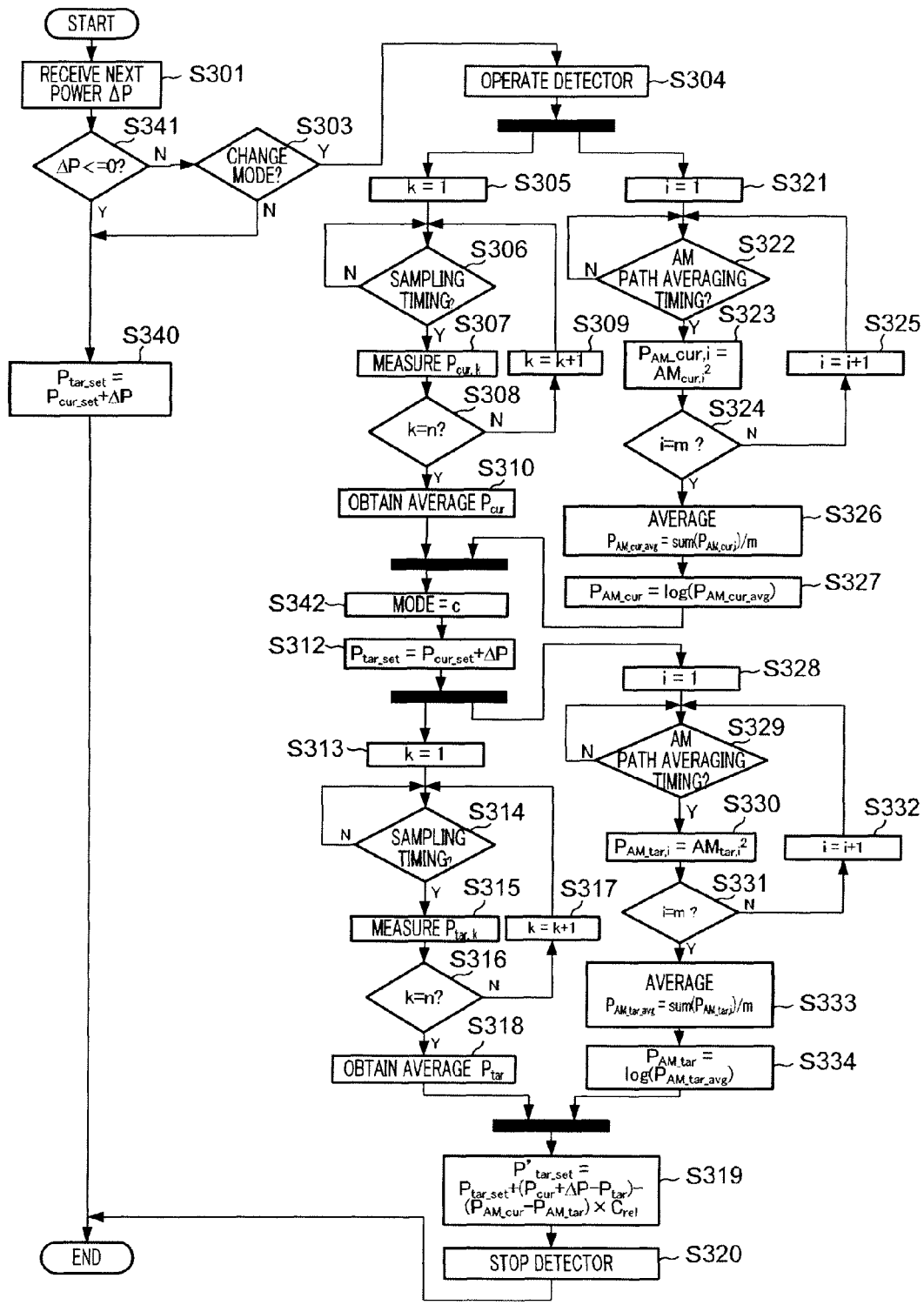
FIG. 23 is a flowchart illustrating the operation of the polar modulation transmitter when current mode is uncompressed mode.

FIG. 23 is a flowchart illustrating the operation of polar modulation transmitter 200 when current mode is uncompressed mode. In FIG. 23, the same steps as in FIG. 22 will be assigned the same reference numbers and repetition of description will be omitted. In FIG. 23, it is decided whether or not the amount of drift ΔP is zero or less in step S341 instead of step S302 of FIG. 22, and mode is changed from uncompressed mode to compressed mode in step S342 instead of step S311 of FIG. 22.

Further, although the relationship between the first and second power measurement timings and symbol boundary timings is not defined expressly, the present invention can be applied to cases where the first power measurement timing comes before the symbol boundary and the second power measurement timing comes after the symbol boundary.

Although, if a channel is focused upon, transmission power is changed in slot units, transmission power is changed in symbol units depending on the relationship between slot timings between channels, and so the symbol boundary means a timing when transmission power is likely to be changed. According to the configuration of this embodiment, the present invention can be applied to cases where the β condition is different between before and after the symbol boundary.

For example, with HSUPA signals, residual component signals included in amplitude component signals are different between before and after the symbol boundary. Accordingly, by controlling transmission power based on the amount of drift in the average output power value of PA 103 between before and after the symbol boundary and the amount of drift in the average value of amplitude component signals between before and after the symbol boundary, even when the first power measurement timing comes before the symbol boundary and the second power measurement timing comes after the symbol boundary, it is possible to eliminate the influence of residual drift components due to drifts with drift components included in the amplitude component signals between before and after the symbol boundary.

Further, the present invention can be applied to cases where the first power measurement timing comes before the symbol boundary, the second power measurement timing comes after the symbol boundary and the β ratio is different between before and after the symbol boundary.

For example, with HSUPA signals, when the β ratio is different between before and after the symbol boundary, the residual components included in amplitude component signals are different between before and after the symbol boundary. Accordingly, by controlling transmission power based on the amount of drift in the average output power value of PA 103 between before and after the β ratio changes and the amount of drift in the average value of amplitude component signals between before and after the β ratio changes, even when the first power measurement timing comes before the symbol boundary, the second power measurement timing comes after the symbol boundary and the β ratio is different between before and after the symbol boundary, it is possible to eliminate the influence of residual drift components due to drifts in with the β ratio.

As explained above, according to this embodiment, by providing averaging section 220 that detects an average power value of amplitude component signals, and controlling transmission power based on the amount of drift in the average output power value of PA 103 and the amount of drift in the average power value of amplitude component signals, when residual drift components are included in the average output power value of PA 103, the influence of residual drift components can be eliminated and transmission power can be controlled, so that it is possible to improve the accuracy of transmission power control. That is, deterioration of power estimation accuracy resulting from residual drift components can be reduced, so that it is possible to fulfill the restrictive requirement that the difference between transmission power be within, for example, the range of +/−0.5 dB.

Also, transmission power control section 107 sets in advance correlation coefficient C that shows the ratio of residual drift components included in the average output power value of PA 103 to residual drift components included in the average output power value of amplitude component signals, and finds residual drift components by multiplying the average output power value of the amplitude component signals by correlation coefficient C. Then, the power estimation value is determined by subtracting the determined residual drift components from the average output power value of PA 103 and transmission power is controlled based on this power estimation value, so that it is possible to eliminate the influence of residual drift components included in the average output power value of PA 103 and reliably improve the accuracy of transmission power control.

Further, by using low-pass filters or integrators with the same time constant for LPF 108 that detects an average output power value of PA 103 and averaging section 111 that detects an average output power value of amplitude component signals, residual drift components included in the average output power value of PA 103 and residual drift components included in the average output power value of the amplitude component signals can be coordinated reliably.

This is because the cutoff frequency of the signal that is detected is determined based on the time constant for LPF 108 that detects the average output power value of PA 103 and the time constant for the low-pass filters or the integrators used in averaging section 220, and the accuracy of estimating residual drift components deteriorates due to the difference between these time constants. By the way, the tolerance for the time constant differs depending on the range of the accuracy of device design and temperature variations, but is preferably within a range of around ±10%.

The present invention is not limited to the above described embodiments, and various variations and modifications may be possible without departing from the scope of the present invention.

What is claimed is:

1. A transmission power control method used in a transmission apparatus that is configured to operate a power amplifier in one of a compressed mode and an uncompressed mode, the transmission power control method comprising:
   measuring a first output power of the power amplifier in a first symbol interval before a second symbol interval where a mode of the power amplifier changes;
   determining a target power of the power amplifier after the mode of the power amplifier changes, based on a first measurement result of the first output power and a transmission power control signal;
   measuring a second output power of the power amplifier in the second symbol interval after the mode of the power amplifier changes, the second output power being controlled using the determined target power; and
   determining a first corrected target power, based on a second measurement result of the second output power.

2. The transmission power control method according to claim 1, further comprising:
   measuring a third output power of the power amplifier in the second symbol interval after the mode of the power amplifier changes, the third output power being controlled using the determined first corrected target power; and
   determining a second corrected target power, based on a third measurement result of the third output power, wherein:
   deriving the third measurement result of the third output power comprises using more items of sampling data than those used in deriving the second measurement result of the second output power.

3. A transmission apparatus that is configured to operate a power amplifier in one of a compressed mode and an uncompressed mode, the transmission apparatus comprising:
   a measuring section that measures an output power of the power amplifier; and
   a transmission power control section that controls the output power of the power amplifier based on a measurement result of the measuring section, wherein:
   the measuring section measures the output power of the power amplifier in a first symbol interval before a second symbol interval where a mode of the power amplifier changes; and
   the transmission power control section determines a target power of the power amplifier after the mode of the power amplifier changes, in the second symbol interval, using the measured output power of the power amplifier before the mode of the power amplifier changes.

* * * * *